(12) United States Patent
Kondiles et al.

(10) Patent No.: US 10,712,967 B2
(45) Date of Patent: Jul. 14, 2020

(54) TRANSFERRING DATA BETWEEN MEMORIES UTILIZING LOGICAL BLOCK ADDRESSES

(71) Applicant: Ocient Holdings LLC, Chicago, IL (US)

(72) Inventors: George Kondiles, Chicago, IL (US); Jason Arnold, Chicago, IL (US)

(73) Assignee: Ocient Holdings LLC, Chicago, IL (US)

( * ) Notice: Subject to any disclaimer, the term of this patent is extended or adjusted under 35 U.S.C. 154(b) by 2 days.

(21) Appl. No.: 16/267,787

(22) Filed: Feb. 5, 2019

(65) Prior Publication Data

US 2020/0117383 A1    Apr. 16, 2020

Related U.S. Application Data

(60) Provisional application No. 62/745,787, filed on Oct. 15, 2018.

(51) Int. Cl.
*G06F 3/06* (2006.01)
*G06F 12/0893* (2016.01)

(52) U.S. Cl.
CPC .......... *G06F 3/0647* (2013.01); *G06F 3/0604* (2013.01); *G06F 3/068* (2013.01); *G06F 12/0893* (2013.01); *G06F 3/067* (2013.01); *G06F 2212/608* (2013.01)

(58) Field of Classification Search
None
See application file for complete search history.

(56) References Cited

U.S. PATENT DOCUMENTS

| | | | |
|---|---|---|---|
| 5,548,770 A | 8/1996 | Bridges | |
| 6,230,200 B1 | 5/2001 | Forecast | |
| 6,633,772 B2 | 10/2003 | Ford | |
| 7,499,907 B2 | 3/2009 | Brown | |
| 7,908,242 B1 | 3/2011 | Achanta | |

(Continued)

OTHER PUBLICATIONS

A new high performance fabric for HPC, Michael Feldman, May 2016, Intersect360 Research.

(Continued)

*Primary Examiner* — Brian R Peugh
(74) *Attorney, Agent, or Firm* — Garlick & Markison; Timothy W. Markison

(57) ABSTRACT

A method includes identifying, by a processing entity of a computing device, data units to read from non-volatile memory and to write into ordered buffers of volatile memory. The method further includes generating, by the processing entity, read operations regarding the data units, wherein the number of read operations equals "n". The method further includes tagging, by the processing entity, each read operation of the read operations with a unique ordered tag value. The method further includes receiving, by the processing entity, read responses to the read operations from the non-volatile memory. The method further includes writing, by the processing entity, data units contained in the read responses into the ordered buffers in accordance with the ordered tag values. The method further includes tracking, by the processing entity, consumption of the data units from the ordered buffers.

20 Claims, 37 Drawing Sheets

(56) References Cited

U.S. PATENT DOCUMENTS

| | | | | |
|---|---|---|---|---|
| 8,688,872 | B2* | 4/2014 | Mangano | G06F 5/06 |
| | | | | 710/52 |
| 10,263,919 | B1* | 4/2019 | Matthews | H04L 49/9047 |
| 2001/0051949 | A1 | 12/2001 | Carey | |
| 2002/0032676 | A1 | 3/2002 | Reiner | |
| 2004/0162853 | A1 | 8/2004 | Brodersen | |
| 2008/0133456 | A1 | 6/2008 | Richards | |
| 2009/0063893 | A1 | 3/2009 | Bagepalli | |
| 2009/0183167 | A1 | 7/2009 | Kupferschmidt | |
| 2010/0082577 | A1 | 4/2010 | Mirchandani | |
| 2010/0241646 | A1 | 9/2010 | Friedman | |
| 2010/0274983 | A1 | 10/2010 | Murphy | |
| 2010/0312756 | A1 | 12/2010 | Zhang | |
| 2011/0219169 | A1 | 9/2011 | Zhang | |
| 2012/0109888 | A1 | 5/2012 | Zhang | |
| 2012/0151118 | A1 | 6/2012 | Flynn | |
| 2012/0185866 | A1 | 7/2012 | Couvee | |
| 2012/0254252 | A1 | 10/2012 | Jin | |
| 2012/0311246 | A1* | 12/2012 | McWilliams | G06F 12/0284 |
| | | | | 711/103 |
| 2013/0332484 | A1 | 12/2013 | Gajic | |
| 2014/0047095 | A1 | 2/2014 | Breternitz | |
| 2014/0136510 | A1 | 5/2014 | Parkkinen | |
| 2014/0188841 | A1 | 7/2014 | Sun | |
| 2015/0205607 | A1 | 7/2015 | Lindholm | |
| 2015/0244804 | A1 | 8/2015 | Warfield | |
| 2015/0248366 | A1 | 9/2015 | Bergsten | |
| 2015/0293966 | A1 | 10/2015 | Cai | |
| 2015/0310045 | A1 | 10/2015 | Konik | |
| 2016/0034547 | A1 | 2/2016 | Lerios | |

OTHER PUBLICATIONS

Alechina, N. (2006-2007). B-Trees. School of Computer Science, University of Nottingham, http://www.cs.nott.ac.uk/~psznza/G5BADS06/lecture13-print.pdf. 41 pages.

Amazon DynamoDB: ten things you really should know, Nov. 13, 2015, Chandan Patra, http://cloudacademy. .com/blog/amazon-dynamodb-ten-thing.

An Inside Look at Google BigQuery, by Kazunori Sato, Solutions Architect, Cloud Solutions team, Google Inc., 2012.

Big Table, a NoSQL massively parallel table, Paul Krzyzanowski, Nov. 2011, https://www.cs.rutgers.edu/pxk/417/notes/contentlbigtable.html.

Distributed Systems, Fall2012, Mohsen Taheriyan, http://www-scf.usc.edu/-csci57212011Spring/presentations/Taheriyan.pptx.

International Searching Authority; International Search Report and Written Opinion; International Application No. PCT/US2017/054773; dated Feb. 13, 2018; 17 pgs.

International Searching Authority; International Search Report and Written Opinion; International Application No. PCT/US2017/054784; dated Dec. 28, 2017; 10 pgs.

International Searching Authority; International Search Report and Written Opinion; International Application No. PCT/US2017/066145; dated Mar. 5, 2018; 13 pgs.

International Searching Authority; International Search Report and Written Opinion; International Application No. PCT/US2017/066169; dated Mar. 6, 2018; 15 pgs.

International Searching Authority; International Search Report and Written Opinion; International Application No. PCT/US2018/025729; dated Jun. 27, 2018; 9 pgs.

International Searching Authority; International Search Report and Written Opinion; International Application No. PCT/US2018/034859; dated Oct. 30, 2018; 8 pgs.

MapReduce: Simplied Data Processing on Large Clusters, OSDI 2004, Jeffrey Dean and Sanjay Ghemawat, Google, Inc.

Rodero-Merino, L.; Storage of Structured Data: Big Table and HBase, New Trends in Distributed Systems, MSc Software and Systems, Distributed Systems Laboratory; Oct. 17, 2012; 24 pages.

Step 2: Examine the data model and implementation details, 2016, Amazon Web Services, Inc., http://docs.aws.amazon.com/amazondynamodb/latestldeveloperguide!Ti . . . .

* cited by examiner database system 10 computing device 18 computing device 18 computing device 18 node 37 node 37 node 37 node 37

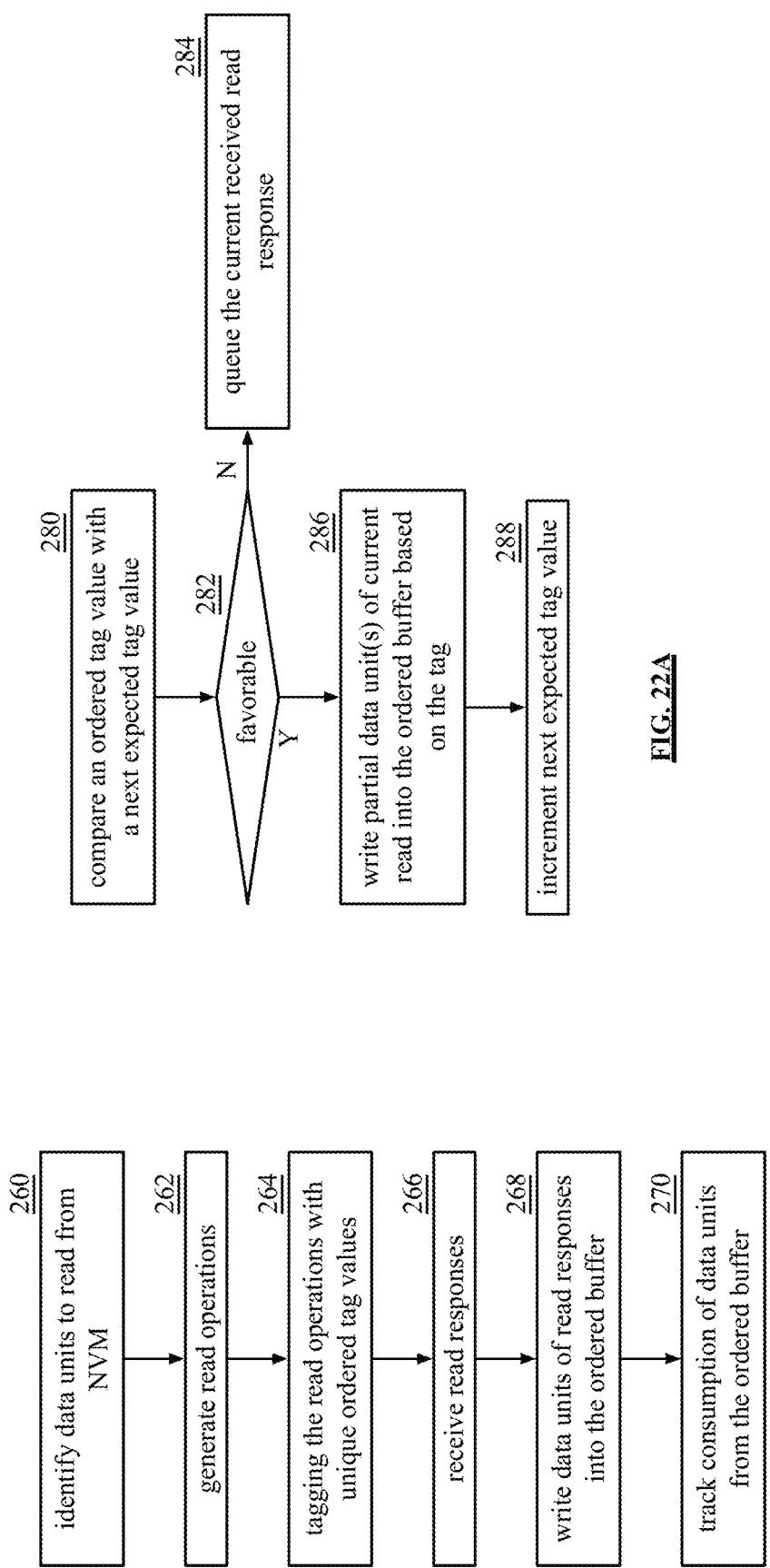

TRANSFERRING DATA BETWEEN MEMORIES UTILIZING LOGICAL BLOCK ADDRESSES

CROSS-REFERENCE TO RELATED APPLICATIONS

The present U.S. Utility Patent Application claims priority pursuant to 35 U.S.C. § 119(e) to U.S. Provisional Application No. 62/745,787, entitled "DATABASE SYSTEM AND OPERATION," filed Oct. 15, 2018, which is hereby incorporated herein by reference in its entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to computer networking and more particularly to database system and operation.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function.

Of the many applications a computer can perform, a database system is one of the largest and most complex applications. In general, a database system stores a large amount of data in a particular way for subsequent processing. In some situations, the hardware of the computer is a limiting factor regarding the speed at which a database system can process a particular function. In some other instances, the way in which the data is stored is a limiting factor regarding the speed of execution. In yet some other instances, restricted co-process options are a limiting factor regarding the speed of execution.

BRIEF DESCRIPTION OF THE SEVERAL VIEWS OF THE DRAWING(S)

FIGS. 22 and 22A are a logic diagram of an example of a method for creating tagged read operations and processing responses thereto in accordance with the present invention;

DETAILED DESCRIPTION OF THE INVENTION

Figure 1:
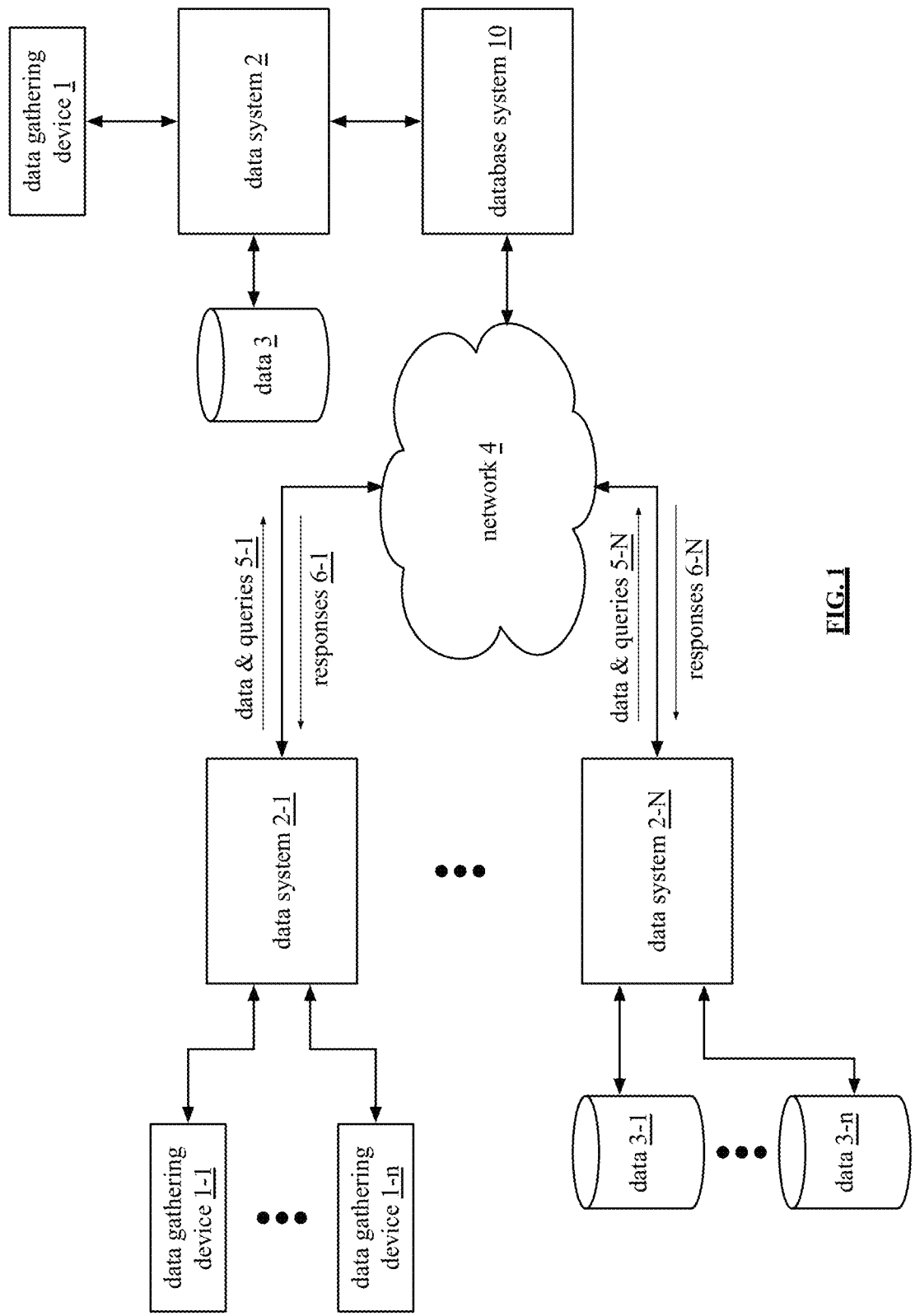
FIG. 1 is a schematic block diagram of an embodiment of a large scale data processing network that includes a database system in accordance with the present invention.

FIG. 1 is a schematic block diagram of an embodiment of a large-scale data processing network that includes data gathering device 1, data gathering devices 1-1 through 1-*n*, data system 2, data systems 2-1 through 2-N, data 3, data 3-1 through 3-*n*, a network 4, and a database system 10. The data systems 2-1 through 2-N provide, via the network 4, data and queries 5-1 through 5-N data to the database system 10. Alternatively, or in addition to, the data system 2 provides further data and queries directly to the database system 10. In response to the data and queries, the database system 10 issues, via the network 4, responses 6-1 through 6-N to the data systems 2-1 through 2-N. Alternatively, or in addition to, the database system 10 provides further responses directly to the data system 2. The data gathering devices 1, 1-1 through 1-*n* may be implemented utilizing sensors, monitors, handheld computing devices, etc. and/or a plurality of storage devices including hard drives, cloud storage, etc. The data gathering devices 1-1 through 1-*n* may provide real-time data to the data system 2-1 and/or any other data system and the data 3-1 through 3-*n* may provide stored data to the data system 2-N and/or any other data system.

Figure 1A:
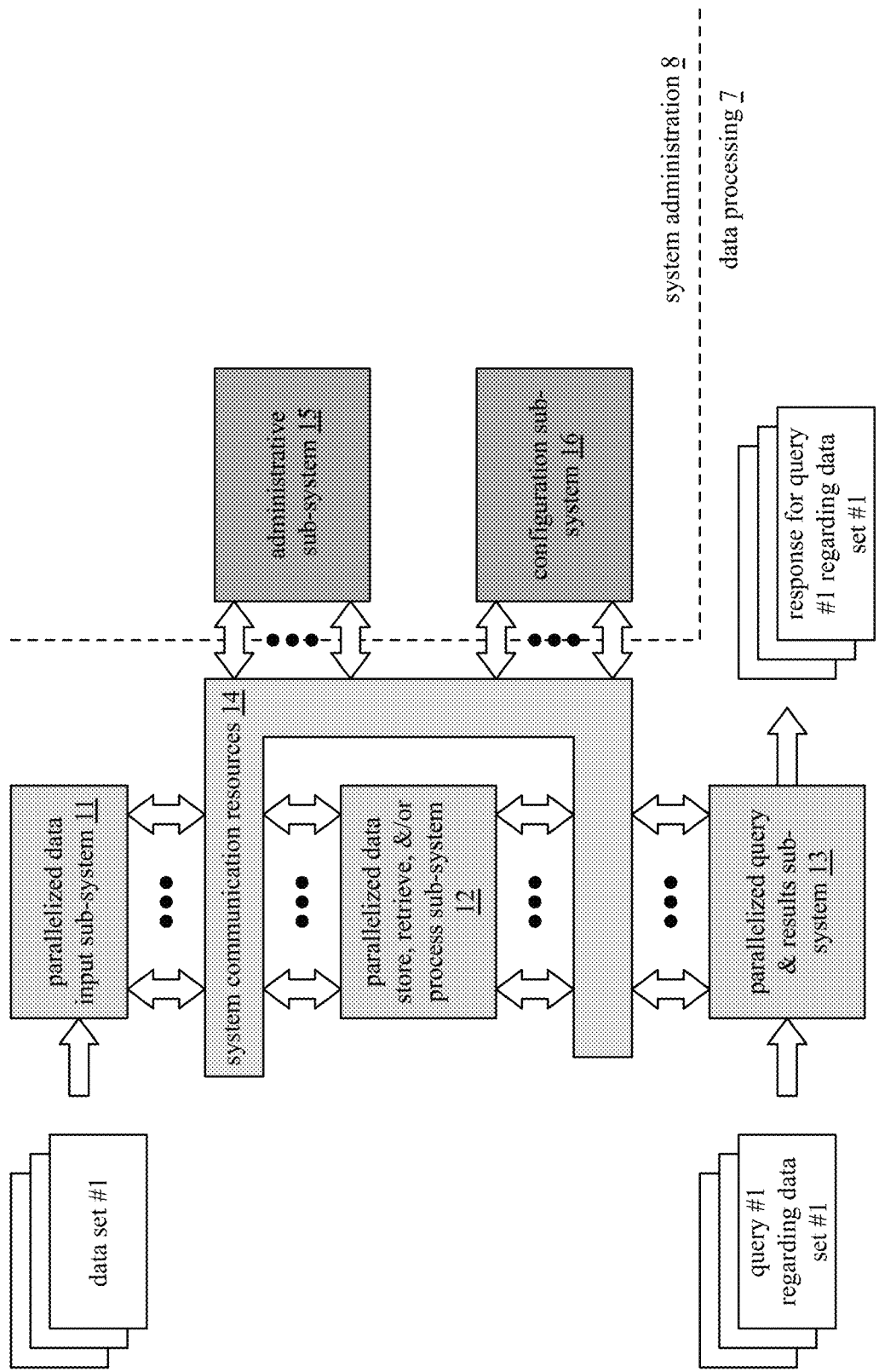
FIG. 1A is a schematic block diagram of an embodiment of a database system in accordance with the present invention.

FIG. 1A is a schematic block diagram of an embodiment of a database system 10 that includes data processing 7 and system administration 8. The data processing 7 includes a parallelized data input sub-system 11, a parallelized data store, retrieve, and/or process sub-system 12, a parallelized query and response sub-system 13, and system communication resources 14. The system administration 8 includes an administrative sub-system 15 and a configuration sub-system 16. The system communication resources 14 include one or more of wide area network (WAN) connections, local area network (LAN) connections, wireless connections, wireline connections, etc. to couple the sub-systems 11, 12, 13, 15, and 16 together. Each of the sub-systems 11, 12, 13, 15, and 16 include a plurality of computing devices; an example of which is discussed with reference to one or more of FIGS. 7-9.

In an example of operation, the parallelized data input sub-system 11 receives tables of data from a data source. For example, a data set no. 1 is received when the data source includes one or more computers. As another example, the data source is a plurality of machines. As yet another example, the data source is a plurality of data mining algorithms operating on one or more computers. The data source organizes its data into a table that includes rows and columns. The columns represent fields of data for the rows. Each row corresponds to a record of data. For example, a table include payroll information for a company's employees. Each row is an employee's payroll record. The columns include data fields for employee name, address, department, annual salary, tax deduction information, direct deposit information, etc.

The parallelized data input sub-system 11 processes a table to determine how to store it. For example, the parallelized data input sub-system 11 divides the data into a plurality of data partitions. For each data partition, the parallelized data input sub-system 11 determines a number of data segments based on a desired encoding scheme. As a specific example, when a 4 of 5 encoding scheme is used (meaning any 4 of 5 encoded data elements can be used to recover the data), the parallelized data input sub-system 11 divides a data partition into 5 segments. The parallelized data input sub-system 11 then divides a data segment into data slabs. Using one or more of the columns as a key, or keys, the parallelized data input sub-system 11 sorts the data slabs. The sorted data slabs are sent, via the system communication resources 14, to the parallelized data store, retrieve, and/or process sub-system 12 for storage.

The parallelized query and response sub-system 13 receives queries regarding tables and processes the queries prior to sending them to the parallelized data store, retrieve, and/or process sub-system 12 for processing. For example, the parallelized query and response sub-system 13 receives a specific query no. 1 regarding the data set no. 1 (e.g., a specific table). The query is in a standard query format such as Open Database Connectivity (ODBC), Java Database Connectivity (JDBC), and/or SPARK. The query is assigned to a node within the sub-system 13 for subsequent processing. The assigned node identifies the relevant table, determines where and how it is stored, and determines available nodes within the parallelized data store, retrieve, and/or process sub-system 12 for processing the query.

In addition, the assigned node parses the query to create an abstract syntax tree. As a specific example, the assigned node converts an SQL (Standard Query Language) statement into a database instruction set. The assigned node then validates the abstract syntax tree. If not valid, the assigned node generates a SQL exception, determines an appropriate correction, and repeats. When the abstract syntax tree is validated, the assigned node then creates an annotated abstract syntax tree. The annotated abstract syntax tree includes the verified abstract syntax tree plus annotations regarding column names, data type(s), data aggregation or not, correlation or not, sub-query or not, and so on.

The assigned node then creates an initial query plan from the annotated abstract syntax tree. The assigned node optimizes the initial query plan using a cost analysis function (e.g., processing time, processing resources, etc.). Once the query plan is optimized, it is sent, via the system communication resources 14, to the parallelized data store, retrieve, and/or process sub-system 12 for processing.

Within the parallelized data store, retrieve, and/or process sub-system 12, a computing device is designated as a primary device for the query plan and receives it. The primary device processes the query plan to identify nodes within the parallelized data store, retrieve, and/or process sub-system 12 for processing the query plan. The primary device then sends appropriate portions of the query plan to the identified nodes for execution. The primary device receives responses from the identified nodes and processes them in accordance with the query plan. The primary device provides the resulting response to the assigned node of the parallelized query and response sub-system 13. The assigned node determines whether further processing is needed on the resulting response (e.g., joining, filtering, etc.). If not, the assigned node outputs the resulting response as the response to the query (e.g., a response for query no. 1 regarding data set no. 1). If, however, further processing is determined, the assigned node further processes the resulting response to produce the response to the query.

Figure 2:
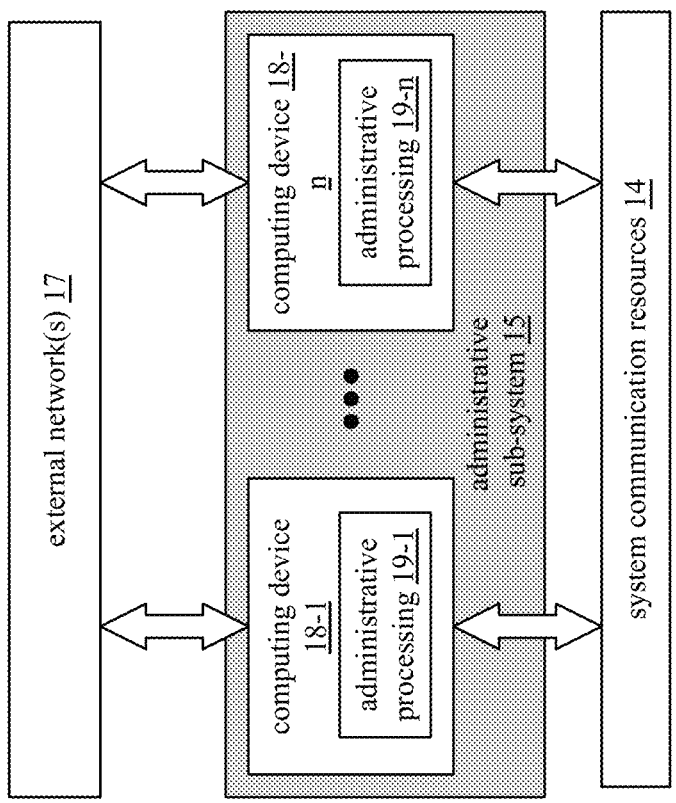
FIG. 2 is a schematic block diagram of an embodiment of an administrative sub-system in accordance with the present invention.

FIG. 2 is a schematic block diagram of an embodiment of the administrative sub-system 15 of FIG. 1A that includes one or more computing devices 18-1 through 18-n. Each of the computing devices executes an administrative processing function utilizing a corresponding administrative processing of administrative processing 19-1 through 19-n (which includes a plurality of administrative operations) that coordinates system level operations of the database system. Each computing device is coupled to an external network 17, or networks, and to the system communication resources 14 of FIG. 1A.

As will be described in greater detail with reference to one or more subsequent figures, a computing device includes a plurality of nodes and each node includes a plurality of processing core resources. Each processing core resource is capable of executing at least a portion of an administrative operation independently. This supports lock free and parallel execution of one or more administrative operations.

Figure 3:
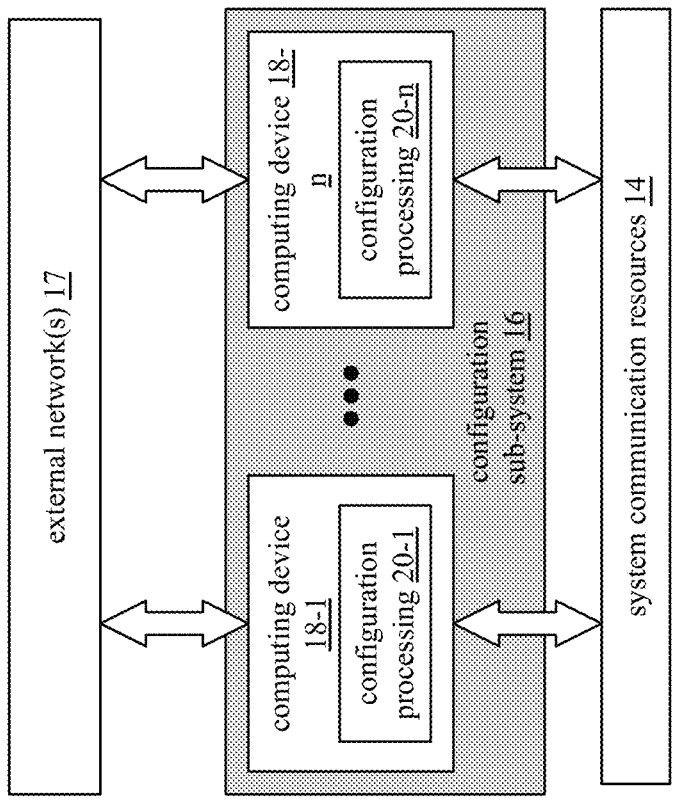
FIG. 3 is a schematic block diagram of an embodiment of a configuration sub-system in accordance with the present invention.

FIG. 3 is a schematic block diagram of an embodiment of the configuration sub-system 16 of FIG. 1A that includes one or more computing devices 18-1 through 18-n. Each of the computing devices executes a configuration processing function utilizing a corresponding configuration processing of configuration processing 20-1 through 20-n (which includes a plurality of configuration operations) that coordinates system level configurations of the database system. Each computing device is coupled to the external network 17 of FIG. 2, or networks, and to the system communication resources 14 of FIG. 1A.

As will be described in greater detail with reference to one or more subsequent figures, a computing device includes a plurality of nodes and each node includes a plurality of processing core resources. Each processing core resource is capable of executing at least a portion of an configuration operation independently. This supports lock free and parallel execution of one or more configuration operations.

Figure 4:
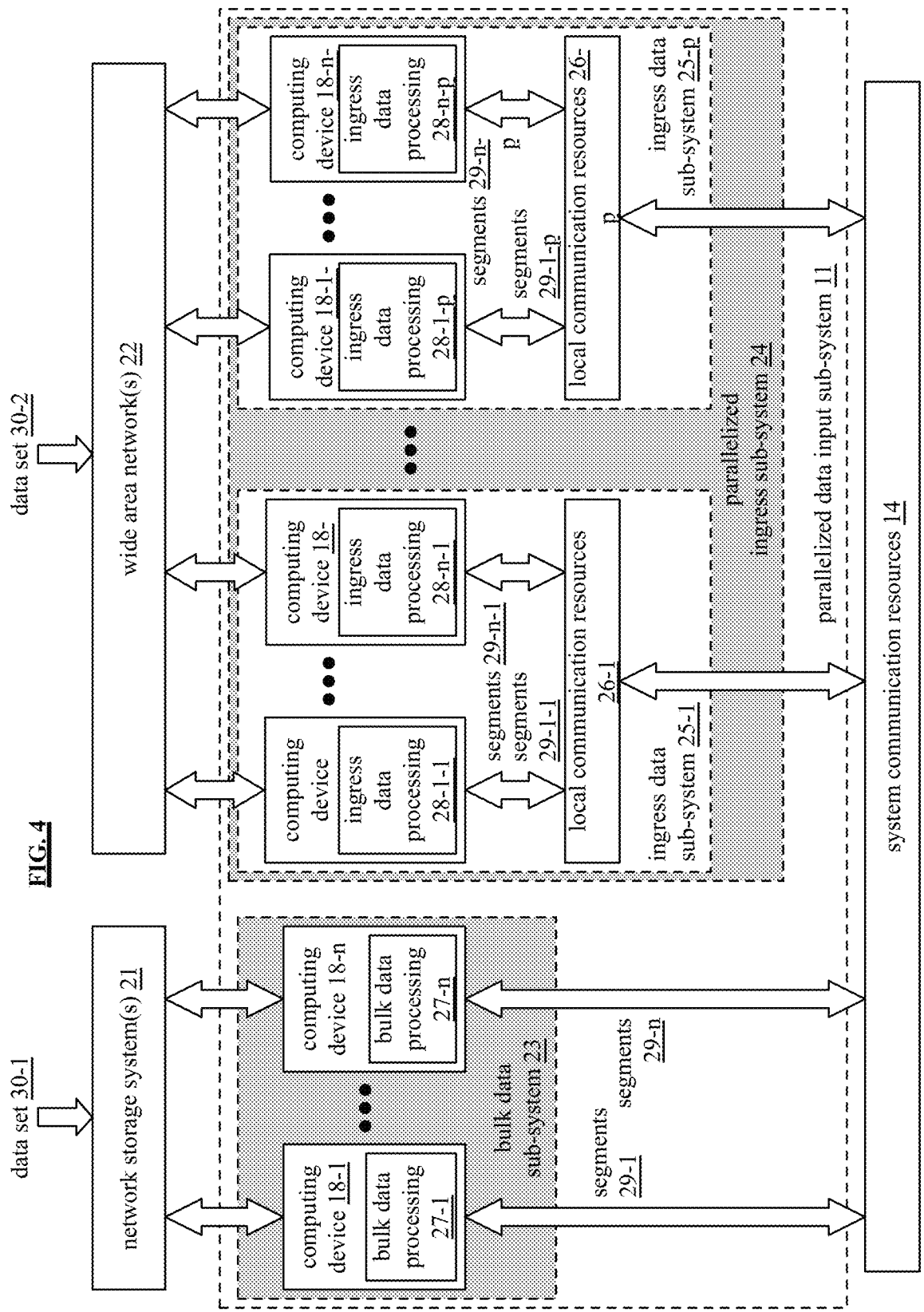
FIG. 4 is a schematic block diagram of an embodiment of a parallelized data input sub-system in accordance with the present invention.

FIG. 4 is a schematic block diagram of an embodiment of the parallelized data input sub-system 11 of FIG. 1A that includes a bulk data sub-system 23 and a parallelized ingress sub-system 24. The bulk data sub-system 23 includes a plurality of computing devices 18-1 through 18-n. The computing devices of the bulk data sub-system 23 execute a bulk data processing function to retrieve a table from a network storage system 21 (e.g., a server, a cloud storage service, etc.).

The parallelized ingress sub-system 24 includes a plurality of ingress data sub-systems 25-1 through 25-p that each include a local communication resource of local communication resources 26-1 through 26-p and a plurality of computing devices 18-1 through 18-n. Each of the computing devices of the parallelized ingress sub-system 24 execute an ingress data processing function utilizing an ingress data processing of ingress data processing 28-1 through 28-n of each ingress data sub-system 25-1 through 25-p that enables the computing device to stream data of a table (e.g., a data set 30-2 as segments 29-1-1 through 29-1-n and through 29-1-p through 29-n-p) into the database system 10 of FIG. 1A via a wide area network 22 (e.g., cellular network, Internet, telephone network, etc.). The streaming may further be via corresponding local communication resources 26-1 through 26-p and via the system communication resources 14 of FIG. 1A. With the plurality of ingress data sub-systems 25-1 through 25-p, data from a plurality of tables can be streamed into the database system 10 at one time (e.g., simultaneously utilizing two or more of the ingress data sub-systems 25-1 through 25-$p$ in a parallel fashion).

Each of the bulk data processing function and the ingress data processing function generally function as described with reference to FIG. 1 for processing a table for storage. The bulk data processing function is geared towards retrieving data of a table in a bulk fashion (e.g., a data set 30-1 as the table is stored and retrieved, via the system communication resources 14 of FIG. 1A, from storage as segments 29-1 through 29-$n$). The ingress data processing function, however, is geared towards receiving streaming data from one or more data sources. For example, the ingress data processing function is geared towards receiving data from a plurality of machines in a factory in a periodic or continual manner as the machines create the data.

As will be described in greater detail with reference to one or more subsequent figures, a computing device includes a plurality of nodes and each node includes a plurality of processing core resources. Each processing core resource is capable of executing at least a portion of the bulk data processing function or the ingress data processing function. In an embodiment, a plurality of processing core resources of one or more nodes executes the bulk data processing function or the ingress data processing function to produce the storage format for the data of a table.

Figure 5:
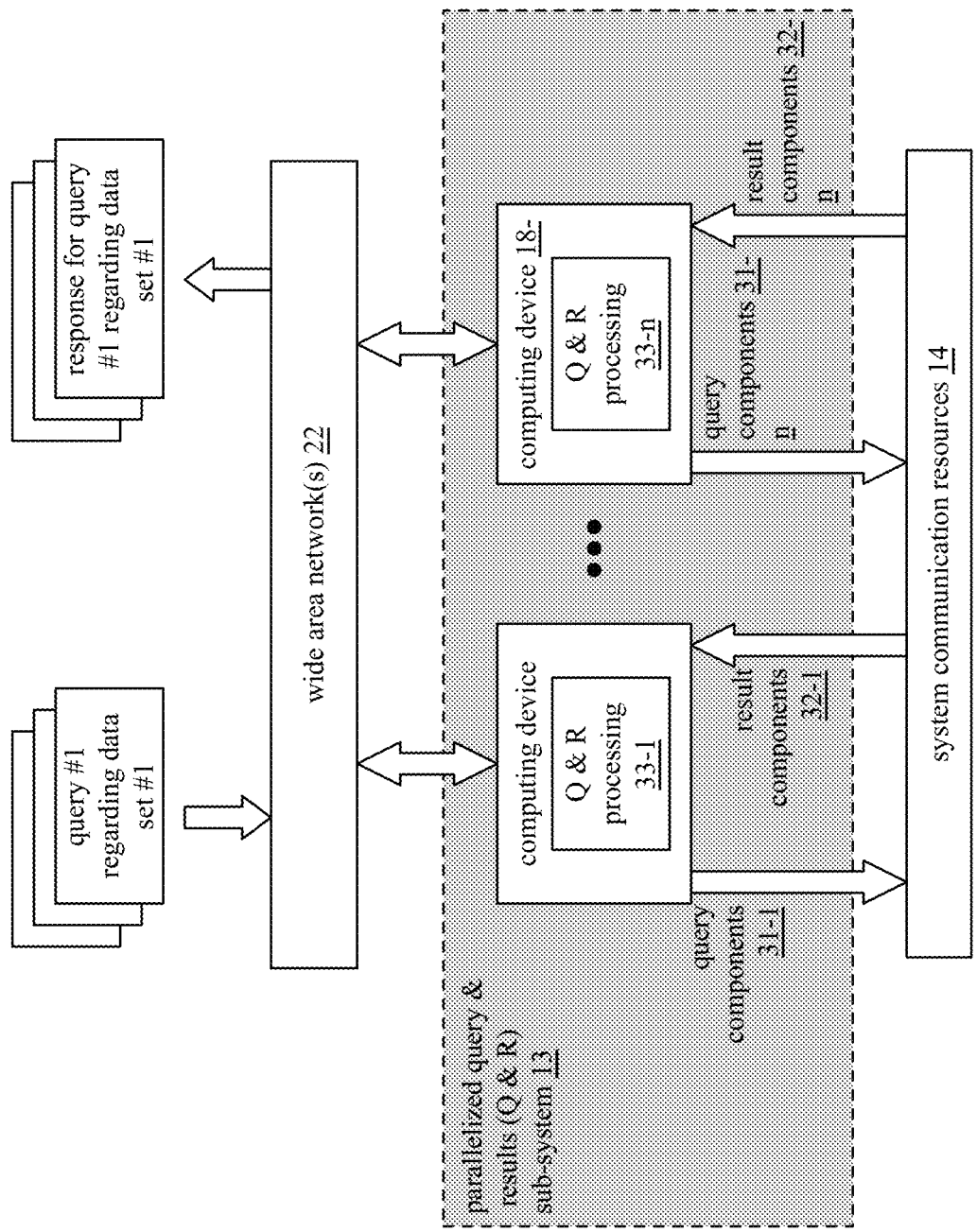
FIG. 5 is a schematic block diagram of an embodiment of a parallelized query and response (Q&R) sub-system in accordance with the present invention.

FIG. 5 is a schematic block diagram of an embodiment of a parallelized query and results sub-system 13 that includes a plurality of computing devices 18-1 through 18-$n$. Each of the computing devices executes a query (Q) & response (R) function utilizing a corresponding Q & R processing of Q & R processing 33-1 through 33-$n$. The computing devices are coupled to the wide area network 22 of FIG. 4 to receive queries (e.g., query no. 1 regarding data set no. 1) regarding tables and to provide responses to the queries (e.g., response for query no. 1 regarding the data set no. 1). For example, the plurality of computing devices 18-1 through 18-$n$ receives a query, via the wide area network 22, issues, via the system communication resources 14 of FIG. 1A, query components 31-1 through 31-$n$ to the parallelized data store, retrieve, &/or process sub-system 12 of FIG. 1A, receives, via the system communication resources 14, results components 32-1 through 32-$n$, and issues, via the wide area network 22, a response to the query.

The Q & R function enables the computing devices to processing queries and create responses as discussed with reference to FIG. 1. As will be described in greater detail with reference to one or more subsequent figures, a computing device includes a plurality of nodes and each node includes a plurality of processing core resources. Each processing core resource is capable of executing at least a portion of the Q & R function. In an embodiment, a plurality of processing core resources of one or more nodes executes the Q & R function to produce a response to a query.

Figure 6:
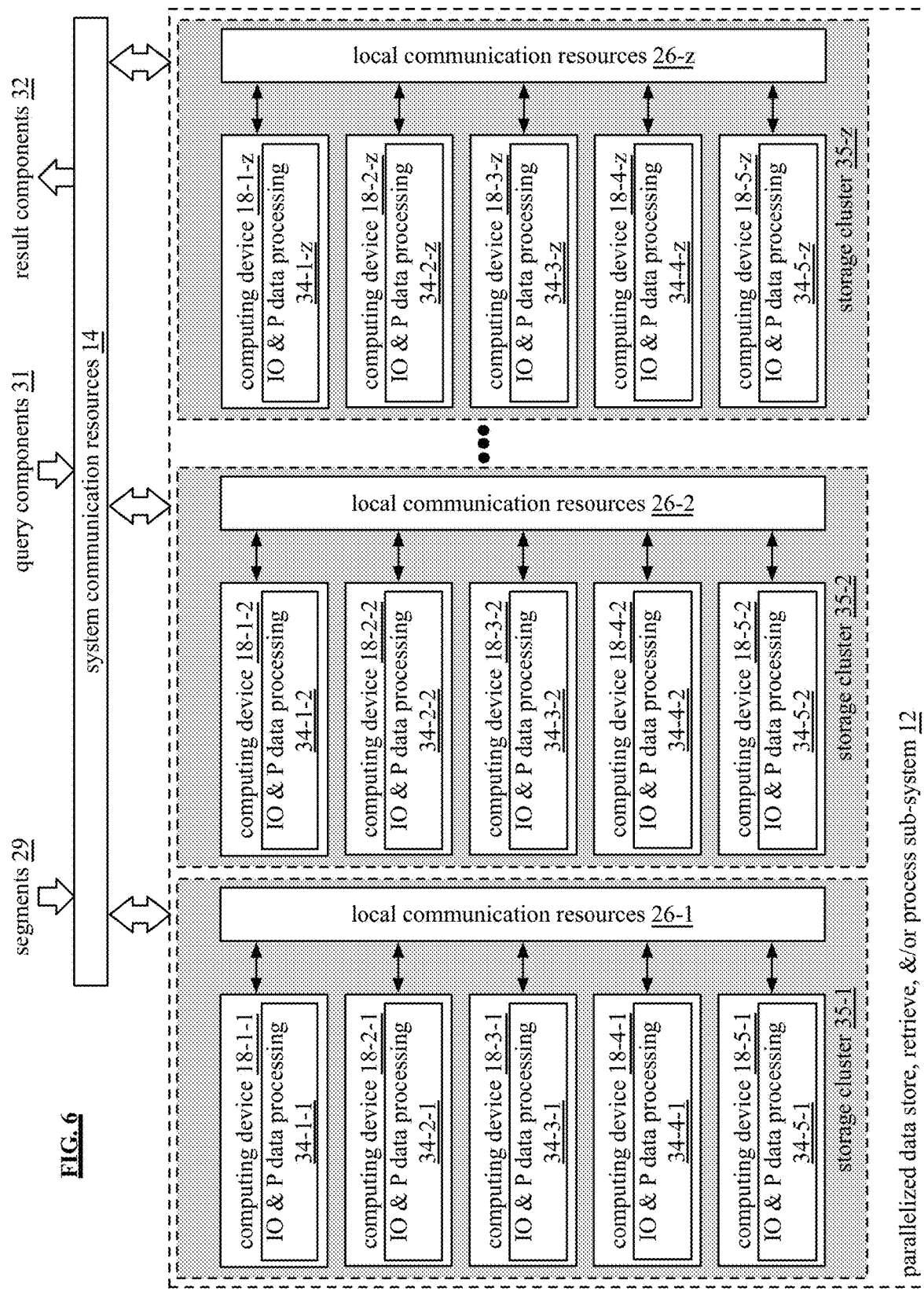
FIG. 6 is a schematic block diagram of an embodiment of a parallelized data store, retrieve, and/or process (IO & P) sub-system in accordance with the present invention.

FIG. 6 is a schematic block diagram of an embodiment of a parallelized data store, retrieve, and/or process sub-system 12 that includes a plurality of storage clusters 35-1 through 35-$z$. Each storage cluster includes a corresponding local communication resource of a plurality of local communication resources 26-1 through 26-$z$ and includes a plurality of computing devices 18-1 through 18-5 and each computing device executes an input, output, and processing (IO &P) function utilizing a corresponding IO &P function of IO &P functions 34-1 through 34-5 to produce at least a portion of a resulting response. Each local communication resource may be implemented with a local communication resource of the local communication resources 26-1 through 26$p$ of FIG. 4. The number of computing devices in a cluster corresponds to the number of segments in which a data partitioned is divided. For example, if a data partition is divided into five segments, a storage cluster includes five computing devices. Each computing device then stores one of the segments. As an example of operation, segments 29 are received, via the system communication resources 14 of FIG. 1A and via the local communication resources 26-1, for storage by computing device 18-4-1. Subsequent to storage, query components 31 (e.g., a query) are received, via the system communication resources 14 and the local communication resources 26-1, by the computing device 18-4-1 for processing by the IO & P data processing 34-4-1 to produce result components 32 (e.g., query response). The computing device 18-4-1 facilitates sending, via the local communication resources 26-1 and the system communication resources 14, the result components 32 to a result receiving entity.

As will be described in greater detail with reference to one or more subsequent figures, a computing device includes a plurality of nodes and each node includes a plurality of processing core resources. Each processing core resource is capable of executing at least a portion of the IO & P function. In an embodiment, a plurality of processing core resources of one or more nodes executes the IO & P function to produce at least a portion of the resulting response as discussed in FIG. 1.

Figure 7:
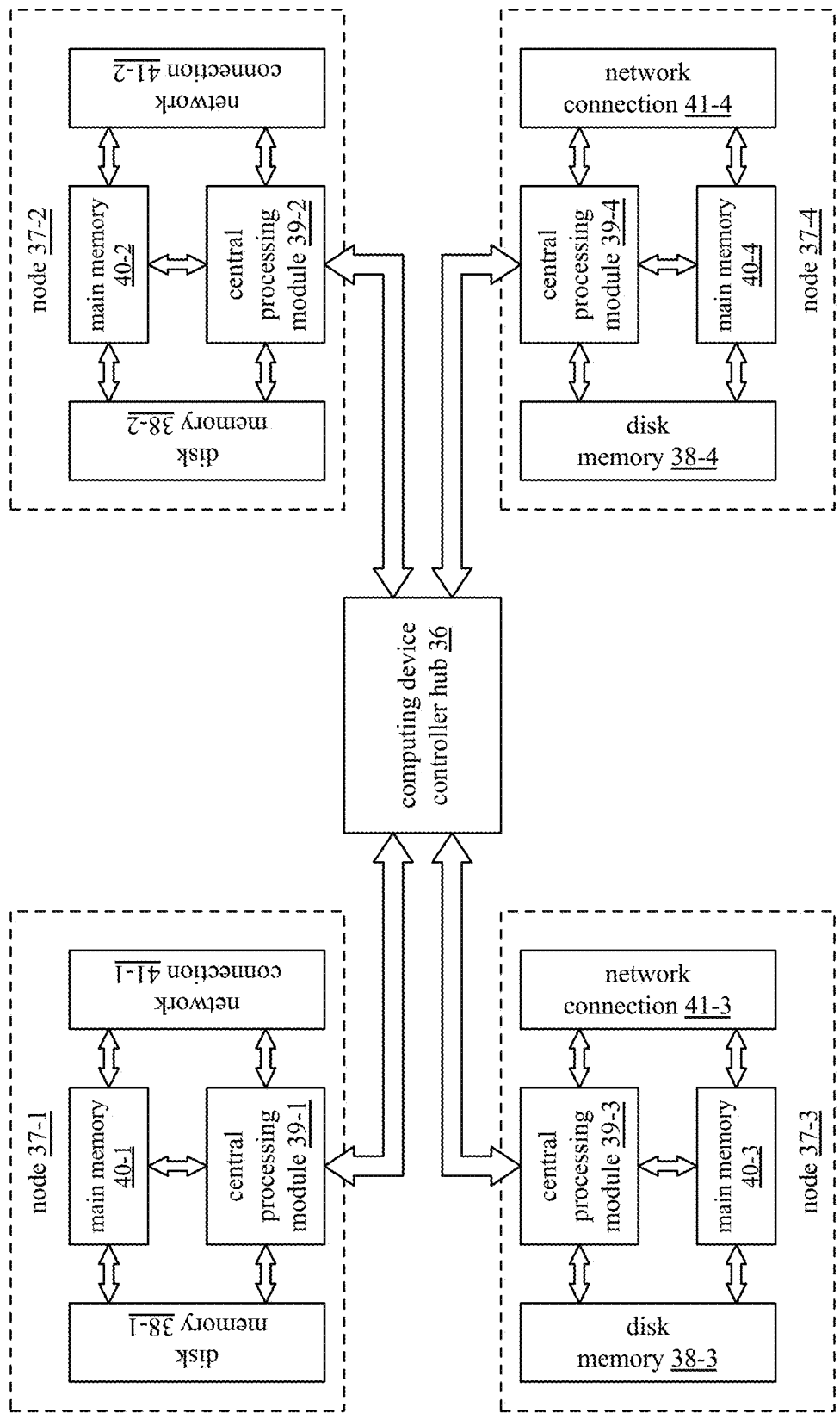
FIG. 7 is a schematic block diagram of an embodiment of a computing device in accordance with the present invention.

FIG. 7 is a schematic block diagram of an embodiment of a computing device 18 that includes a plurality of nodes 37-1 through 37-4 coupled to a computing device controller hub 36. The computing device controller hub 36 includes one or more of a chipset, a quick path interconnect (QPI), and an ultra path interconnection (UPI). Each node 37-1 through 37-4 includes a central processing module of central processing modules 39-1 through 39-4, a main memory of main memories 40-1 through 40-4, a disk memory of disk memories 38-1 through 38-4, and a network connection of network connections 41-1 through 41-4. In an alternate configuration, the nodes share a network connection, which is coupled to the computing device controller hub 36 or to one of the nodes as illustrated in subsequent figures.

In an embodiment, each node is capable of operating independently of the other nodes. This allows for large scale parallel operation of a query request, which significantly reduces processing time for such queries. In another embodiment, one or more node function as co-processors to share processing requirements of a particular function, or functions.

Figure 8:
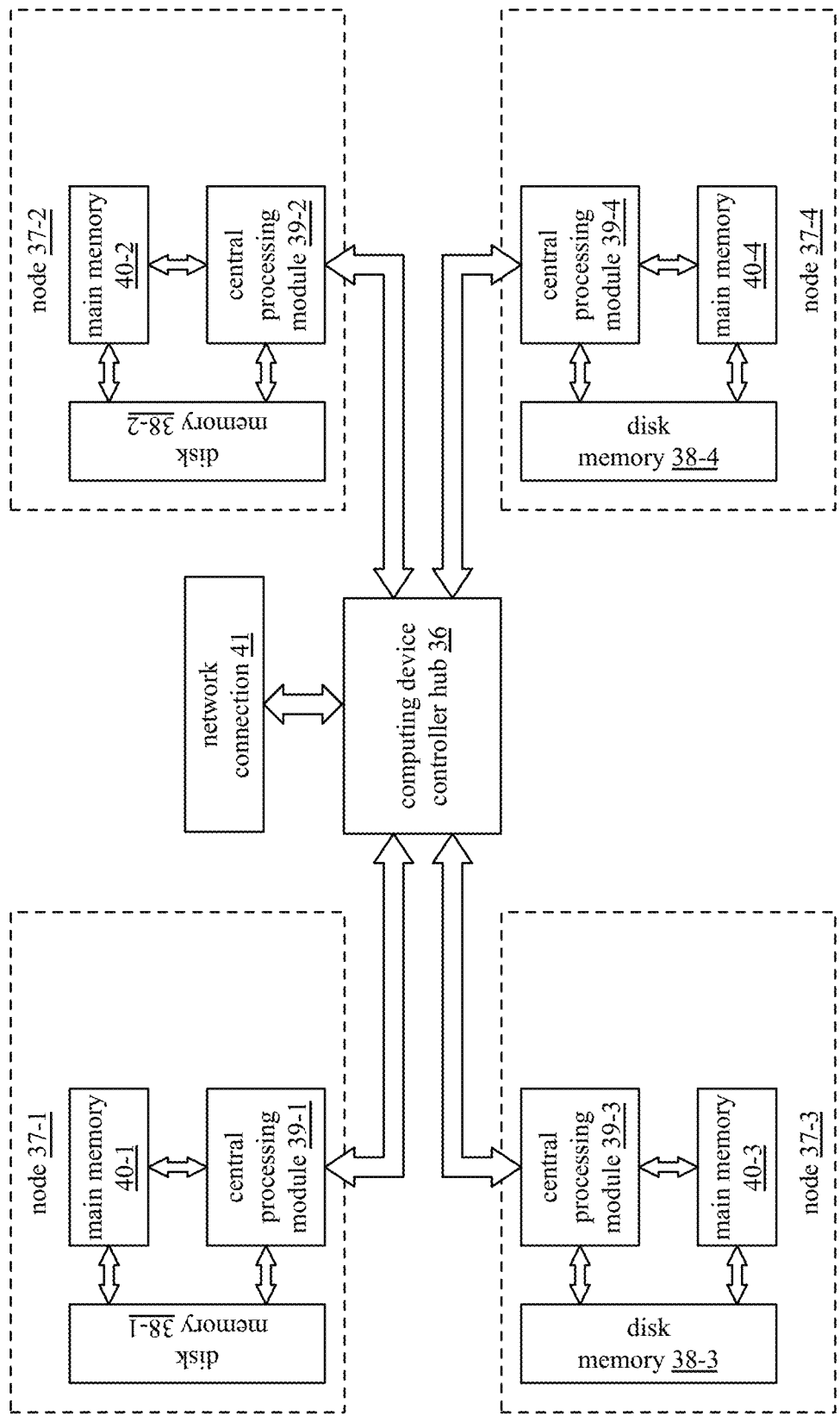
FIG. 8 is a schematic block diagram of another embodiment of a computing device in accordance with the present invention.

FIG. 8 is a schematic block diagram of another embodiment of a computing device is similar to the computing device of FIG. 7 with an exception that it includes a single network connection 41, which is coupled to the computing device controller hub 36. As such, each node coordinates with the computing device controller hub to transmit or receive data via the network connection.

Figure 9:
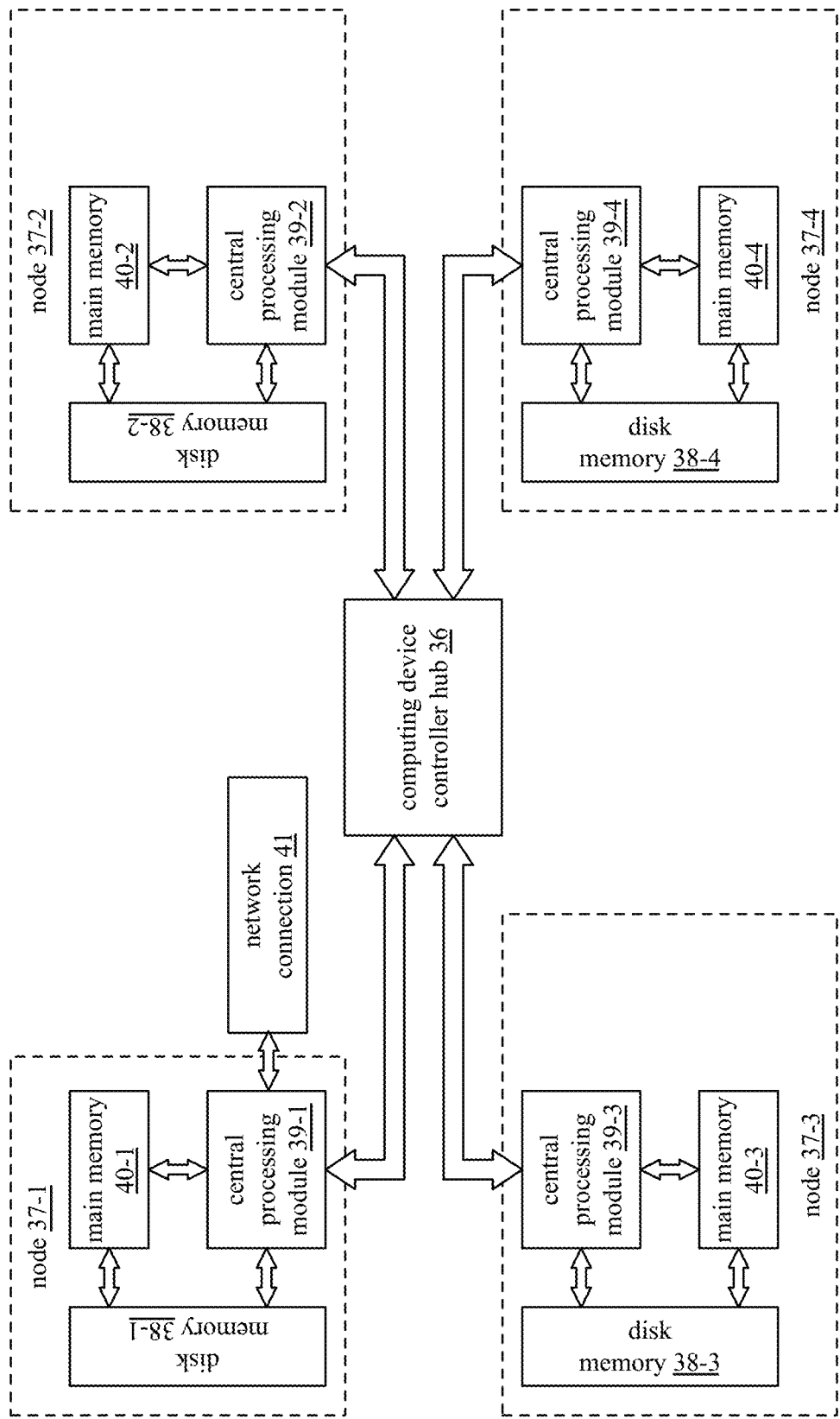
FIG. 9 is a schematic block diagram of another embodiment of a computing device in accordance with the present invention.

FIG. 9 is a schematic block diagram of another embodiment of a computing device is similar to the computing device of FIG. 7 with an exception that it includes a single network connection 41, which is coupled to a central processing module of a node (e.g., to central processing module 39-1 of node 37-1). As such, each node coordinates with the central processing module via the computing device controller hub 36 to transmit or receive data via the network connection.

Figure 10:
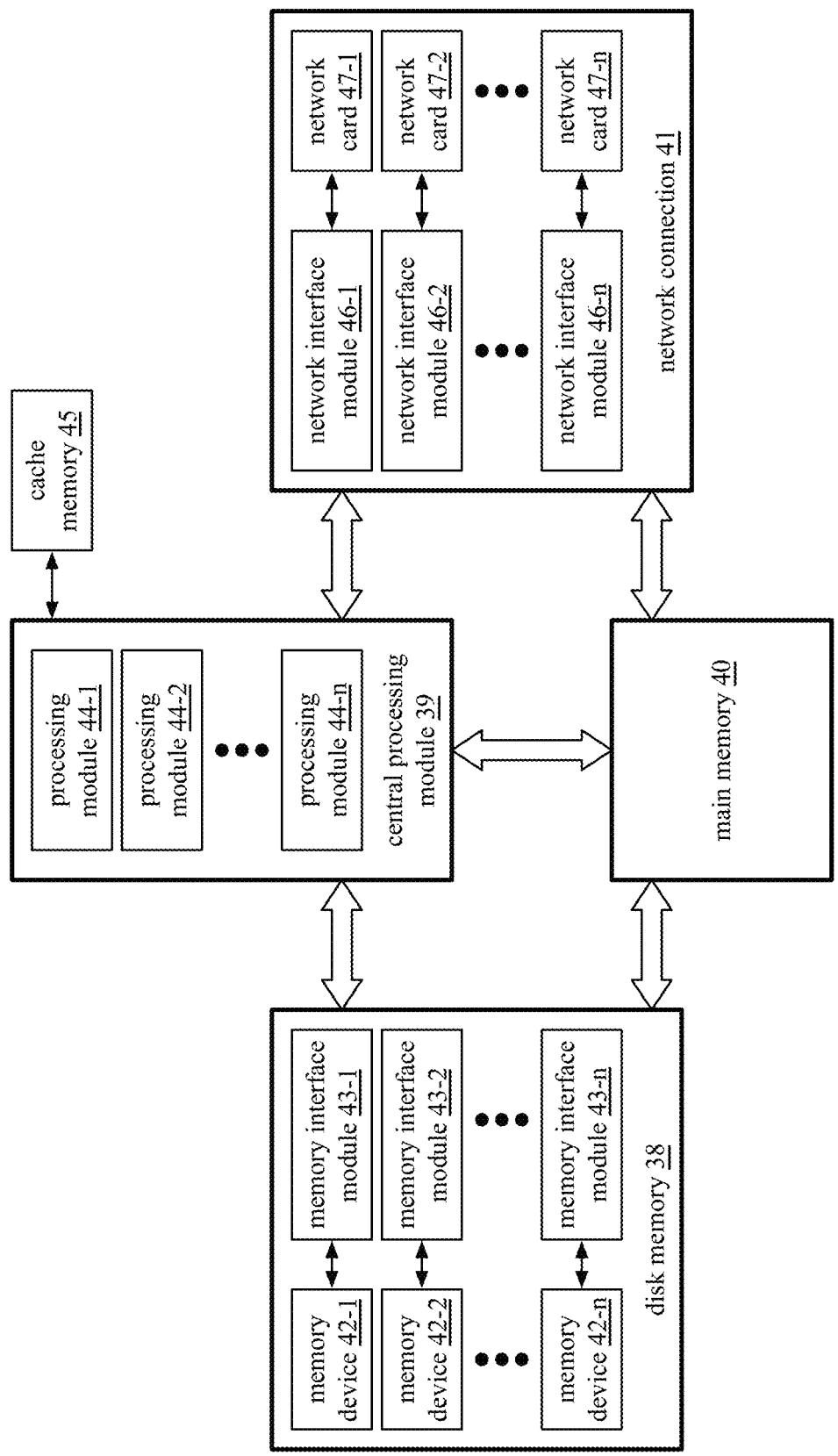
FIG. 10 is a schematic block diagram of an embodiment of a node of a computing device in accordance with the present invention.

FIG. 10 is a schematic block diagram of an embodiment of a node 37 of computing device 18. The node 37 includes the central processing module 39, the main memory 40, the disk memory 38, and the network connection 41. The main memory 40 includes read only memory (RAM) and/or other form of volatile memory for storage of data and/or operational instructions of applications and/or of the operating system. The central processing module 39 includes a plurality of processing modules 44-1 through 44-n and an associated one or more cache memory 45. A processing module is as defined at the end of the detailed description.

The disk memory 38 includes a plurality of memory interface modules 43-1 through 43-n and a plurality of memory devices 42-1 through 42-n. The memory devices 42-1 through 42-n include, but are not limited to, solid state memory, disk drive memory, cloud storage memory, and other non-volatile memory. For each type of memory device, a different memory interface module 43-1 through 43-n is used. For example, solid state memory uses a standard, or serial, ATA (SATA), variation, or extension thereof, as its memory interface. As another example, disk drive memory devices use a small computer system interface (SCSI), variation, or extension thereof, as its memory interface.

In an embodiment, the disk memory 38 includes a plurality of solid state memory devices and corresponding memory interface modules. In another embodiment, the disk memory 38 includes a plurality of solid state memory devices, a plurality of disk memories, and corresponding memory interface modules.

The network connection 41 includes a plurality of network interface modules 46-1 through 46-n and a plurality of network cards 47-1 through 47-n. A network card includes a wireless LAN (WLAN) device (e.g., an IEEE 802.11n or another protocol), a LAN device (e.g., Ethernet), a cellular device (e.g., CDMA), etc. The corresponding network interface modules 46-1 through 46-n include a software driver for the corresponding network card and a physical connection that couples the network card to the central processing module 39 or other component(s) of the node.

The connections between the central processing module 39, the main memory 40, the disk memory 38, and the network connection 41 may be implemented in a variety of ways. For example, the connections are made through a node controller (e.g., a local version of the computing device controller hub 36). As another example, the connections are made through the computing device controller hub 36.

Figure 11:
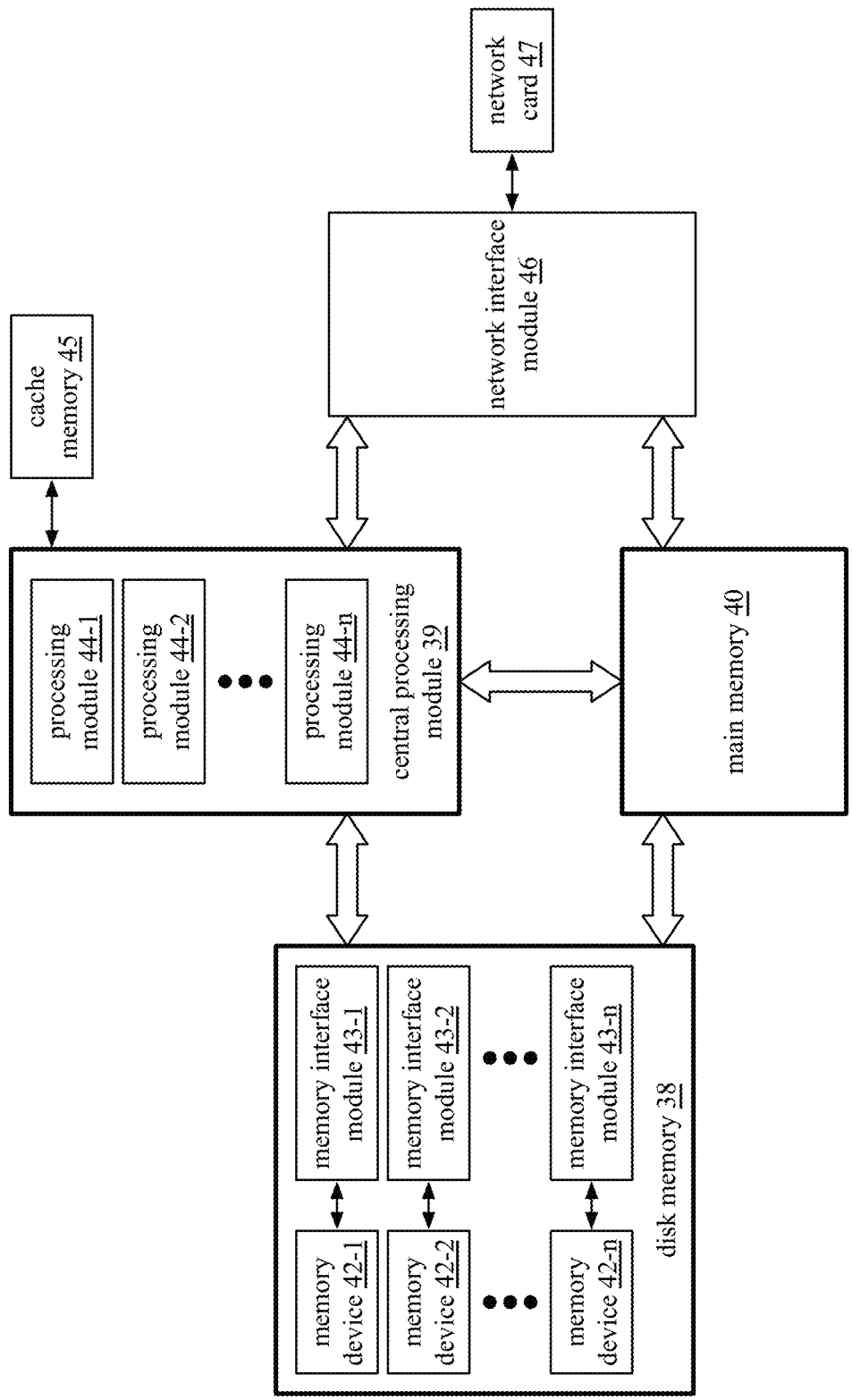
FIG. 11 is a schematic block diagram of an embodiment of a node of a computing device in accordance with the present invention.

FIG. 11 is a schematic block diagram of an embodiment of a node 37 of a computing device 18 that is similar to the node of FIG. 10, with a difference in the network connection. In this embodiment, the node 37 includes a single network interface module 46 and corresponding network card 47 configuration.

Figure 12:
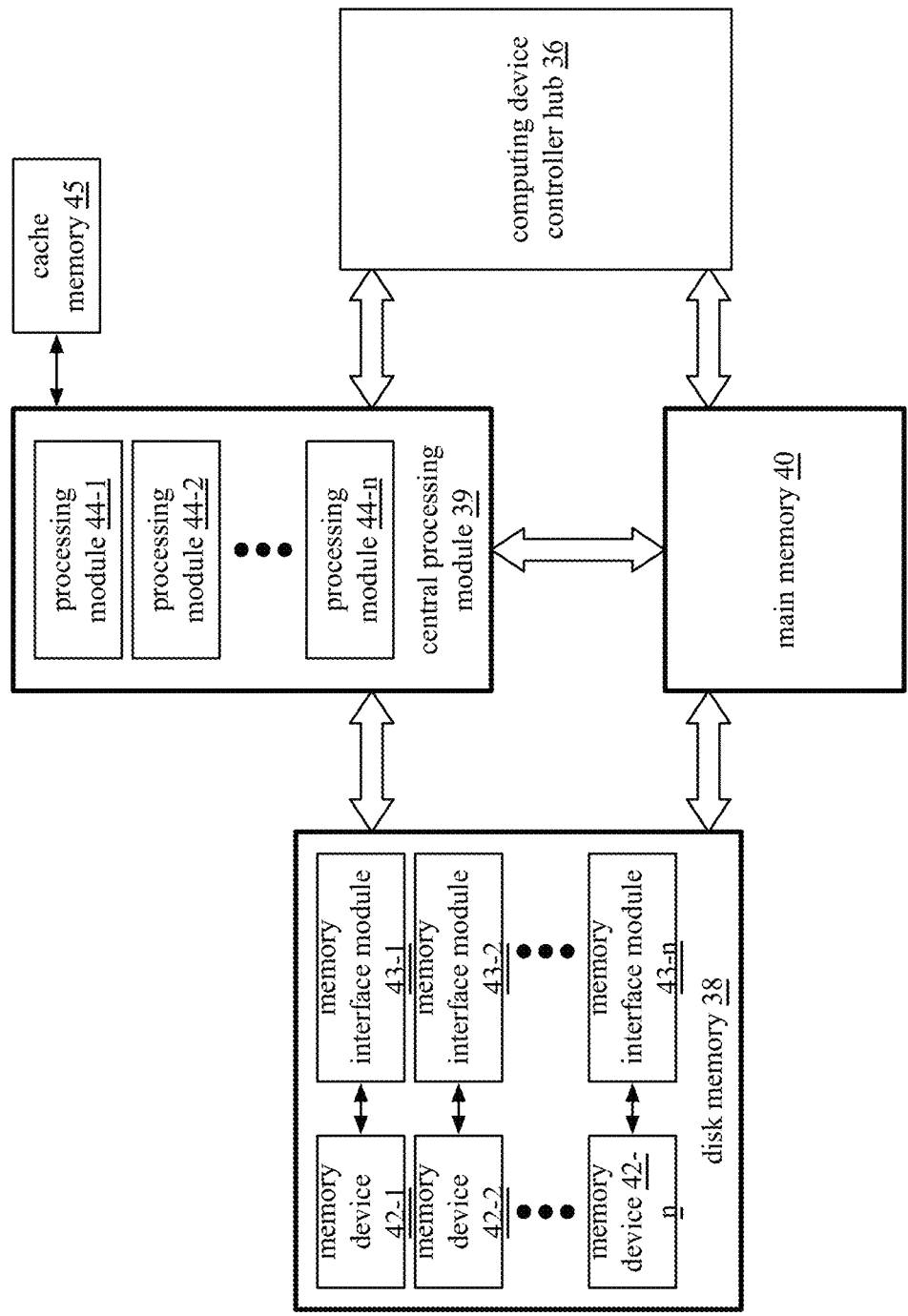
FIG. 12 is a schematic block diagram of an embodiment of a node of a computing device in accordance with the present invention.

FIG. 12 is a schematic block diagram of an embodiment of a node 37 of a computing device 18 that is similar to the node of FIG. 10, with a difference in the network connection. In this embodiment, the node 37 connects to a network connection via the computing device controller hub 36.

Figure 13:
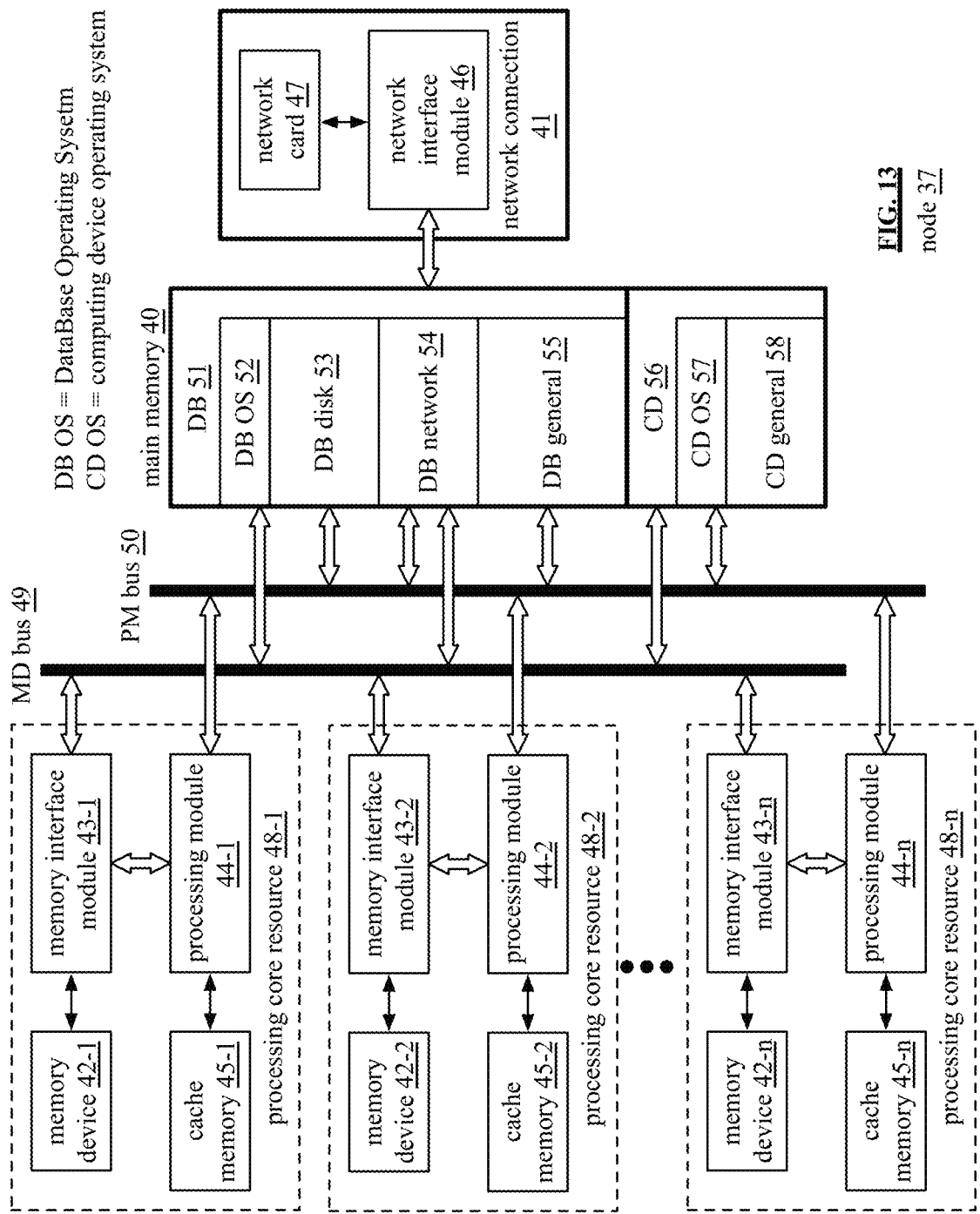
FIG. 13 is a schematic block diagram of an embodiment of a node of a computing device in accordance with the present invention.

FIG. 13 is a schematic block diagram of another embodiment of a node 37 of computing device 18 that includes processing core resources 48-1 through 48-n, a memory device (MD) bus 49, a processing module (PM) bus 50, a main memory 40 and a network connection 41. The network connection 41 includes the network card 47 and the network interface module 46 of FIG. 10. Each processing core resource includes a corresponding processing module of processing modules 44-1 through 44-n, a corresponding memory interface module of memory interface modules 43-1 through 43-n, a corresponding memory device of memory devices 42-1 through 42-n, and a corresponding cache memory of cache memories 45-1 through 45-n. In this configuration, each processing core resource can operate independently of the other processing core resources. This further supports increased parallel operation of database functions to further reduce execution time.

The main memory 40 is divided into a computing device (CD) 56 section and a database (DB) 51 section. The database section includes a database operating system (OS) area 52, a disk area 53, a network area 54, and a general area 55. The computing device section includes a computing device operating system (OS) area 57 and a general area 58. Note that each section could include more or less allocated areas for various tasks being executed by the database system.

In general, the database OS 52 allocates main memory for database operations. Once allocated, the computing device OS 57 cannot access that portion of the main memory 40. This supports lock free and independent parallel execution of one or more operations.

Figure 14:
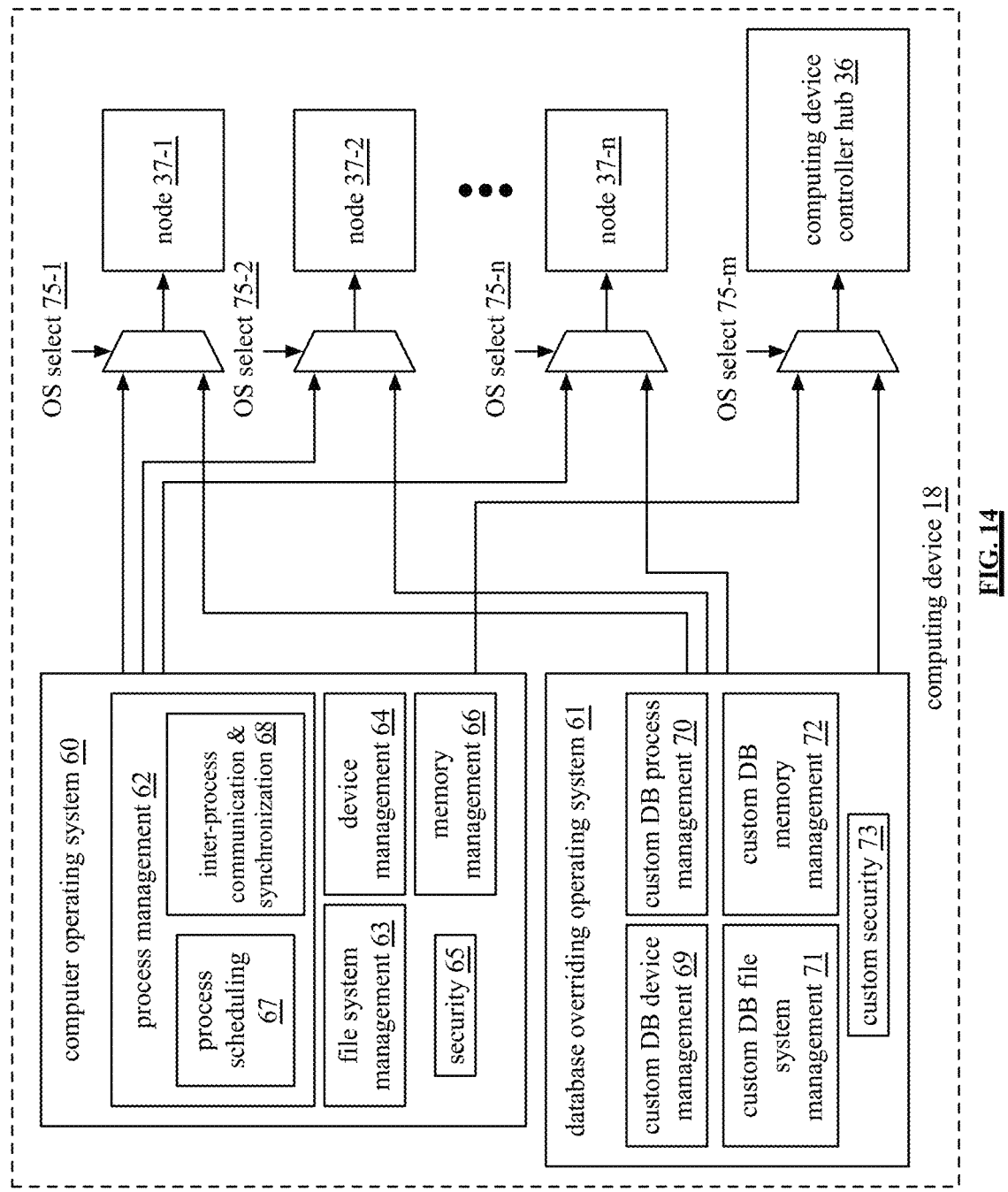
FIG. 14 is a schematic block diagram of an embodiment of operating systems of a computing device in accordance with the present invention.

FIG. 14 is a schematic block diagram of an embodiment of operating systems of a computing device 18. The computing device 18 includes a computer operating system 60 and a database overriding operating system (DB OS) 61. The computer OS 60 includes process management 62, file system management 63, device management 64, memory management 66, and security 65. The processing management 62 generally includes process scheduling 67 and inter-process communication and synchronization 68. In general, the computer OS 60 is a conventional operating system used by a variety of types of computing devices. For example, the computer operating system is a personal computer operating system, a server operating system, a tablet operating system, a cell phone operating system, etc.

The database overriding operating system (DB OS) 61 includes custom DB device management 69, custom DB process management 70 (e.g., process scheduling and/or inter-process communication & synchronization), custom DB file system management 71, custom DB memory management 72, and/or custom security 73. In general, the database overriding OS 61 provides hardware components of a node for more direct access to memory, more direct access to a network connection, improved independency, improved data storage, improved data retrieval, and/or improved data processing than the computing device OS.

In an example of operation, the database overriding OS 61 controls which operating system, or portions thereof, operate with each node and/or computing device controller hub of a computing device (e.g., via OS select 75-1 through 75-n when communicating with nodes 37-1 through 37-n and via OS select 75-m when communicating with the computing device controller hub 36). For example, device management of a node is supported by the computer operating system, while process management, memory management, and file system management are supported by the database overriding operating system. To override the computer OS, the database overriding OS provides instructions to the computer OS regarding which management tasks will be controlled by the database overriding OS. The database overriding OS also provides notification to the computer OS as to which sections of the main memory it is reserving exclusively for one or more database functions, operations, and/or tasks. One or more examples of the database overriding operating system are provided in subsequent figures.

Figure 15:
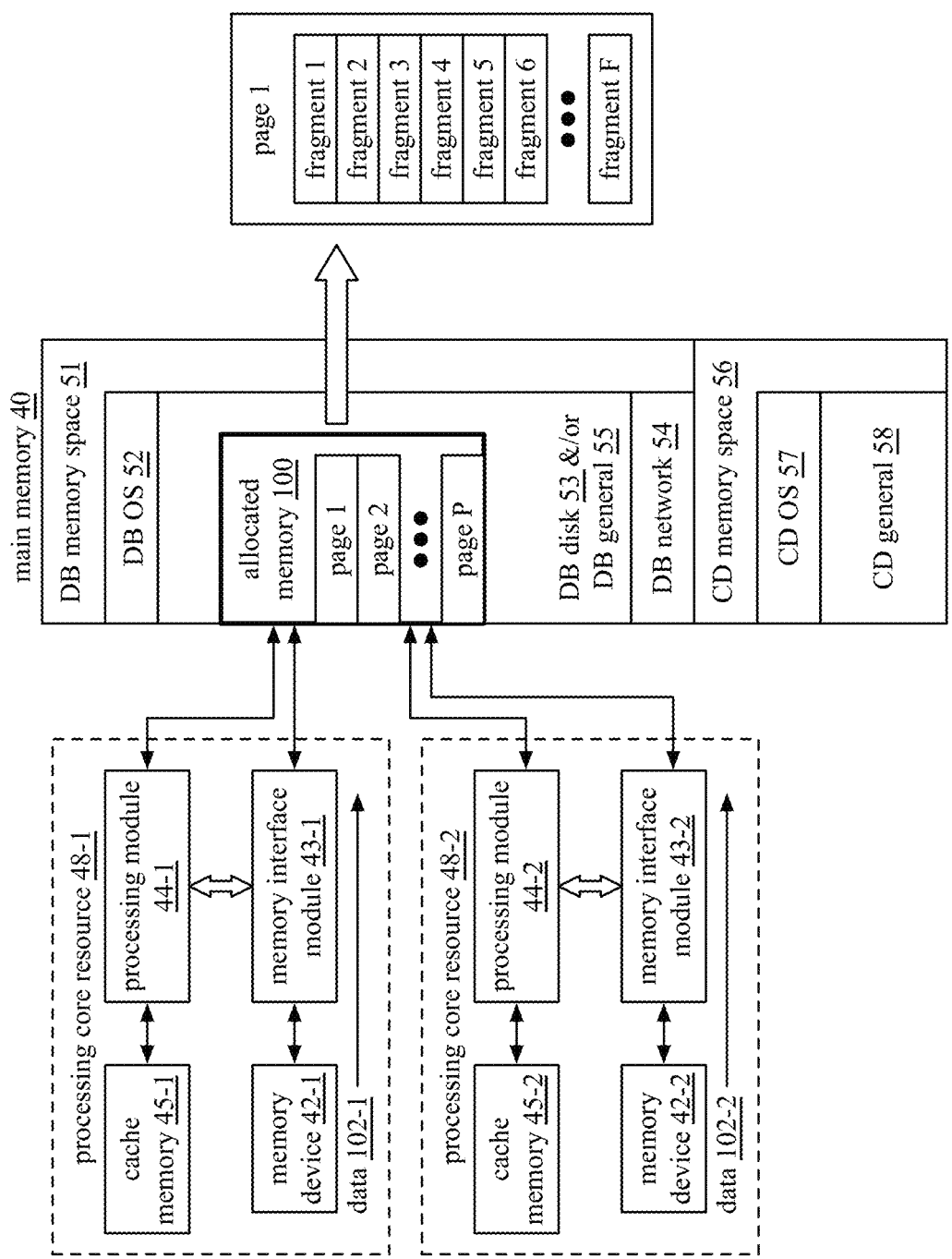
FIG. 15 is a schematic block diagram of an example of allocated memory of main memory being allocated to read data from processing core resources in accordance with the present invention.

FIG. 15 is a schematic block diagram of an example of allocated memory 100 of main memory 40, as discussed with reference to FIGS. 7 and 13, being allocated to read data 102-1 and data 102-2 from respective processing core resources 48-1 and 48-2. The processing core resources respectively includes processing modules 44-1 and 44-2, cache memories 45-1 and 45-2, memory interface modules 43-1 and 43-2, and memory devices 42-1 and 42-2 as previously discussed. The data 102-1 and data 102-2 is stored in the allocated memory 100 in pages 1-P of data blocks. For example, a page is of a selectable size (e.g., 4 KB to 2 GB). In an embodiment, a page size is selected to be 1 or 2 G bytes. When data is read from the memory device 42-1 and written into the allocated memory 100 of the main memory 40, it is desirable to have it done with efficiency in use of memory space and stored in a manner for ease of access for subsequent operations.

In this example, a portion of the DB (database) disk 53 and/or DB general 55 is allocated for storing data 102-1 and 102-2 read from the memory devices 42-1 and 42-2 of the processing core resources 48-1 and 48-2. The allocated memory 100 is of sufficient size to store a plurality of pages of data. To facilitate efficient storage and ease of use, each page is divided into fragments 1-F (e.g., 4 fragments per page or another number of fragments per page). In addition, it is desirable to avoid deadlocks with the data being stored in the allocated memory 100. To accomplish deadlock avoidance, efficiency of storage, and/or ease of use, single producer single consumer (SPSC) buffers are used between each virtual machine (VM, which is a processing core resource 48, a portion thereof, and/or multiple processing core resources).

Figure 16:
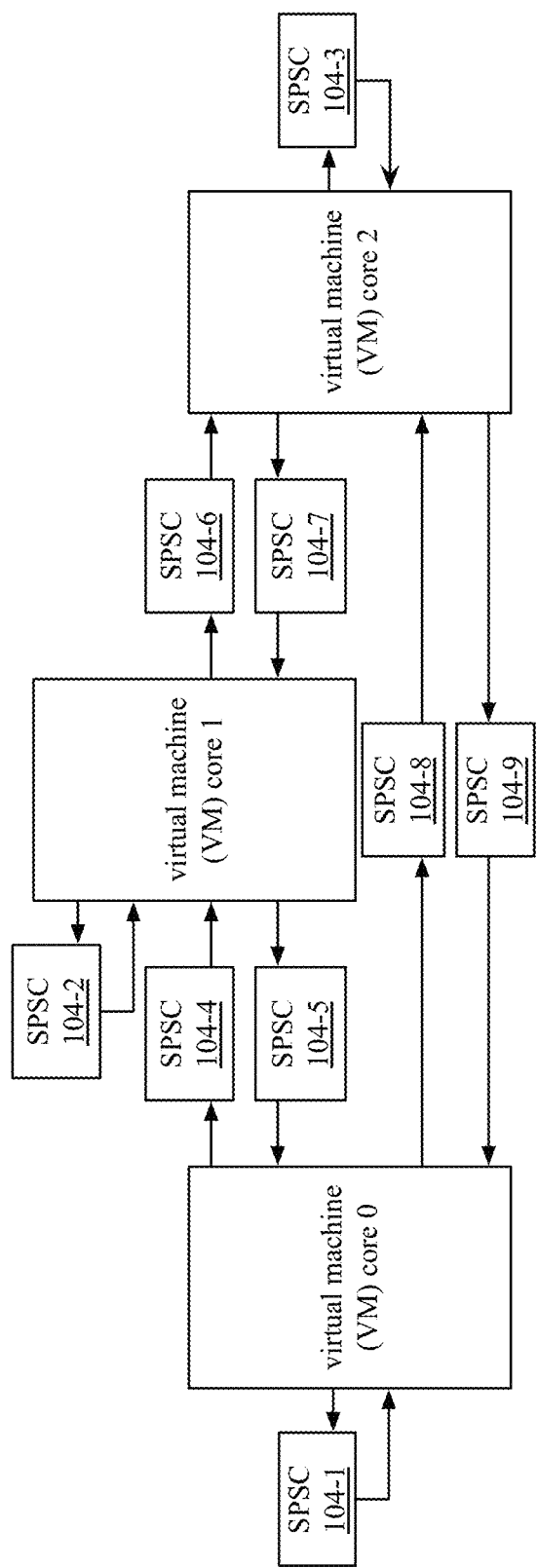
FIG. 16 is a schematic block diagram of an example of allocated memory of main memory including Single Producer Single Consumer (SPSC) buffers between virtual machines of one or more processing core resources in accordance with the present invention.

FIG. 16 is a schematic block diagram of an example of allocated memory of main memory including Single Producer Single Consumer (SPSC) buffers 104-1 through 104-9 between virtual machines 0-2 of one or more processing core resources. An SPSC buffer is a one-way buffer, meaning the producer puts data in the SPSC buffer and only the consumer can take that data out of the buffer. As shown, there are two SPSC buffers between each virtual machine core: one in each direction. In addition, each virtual machine (VM) core has its own SPSC buffer, where the VM core is the producer and the consumer.

The VM cores uses the SPSC buffers to store pointers to the data, not the data itself such that the SPSC buffers are very small in comparison to the data they reference. Use of the SPSC buffers allows the VM cores to execute multiple threads that access the same data and/or permutations of the data. In addition, the VM cores use the same contract terms to help avoid a deadlock. The contract terms include (a) once a VM places data in allocated memory of the DB memory space of the main memory and/or places information in an SPSC buffer, it cannot access that data until it is released by a consumer; and (b) it won't place data in the allocated memory and/or an SPSC unless it knows it can advance the operational sequence of a query.

Figure 17:
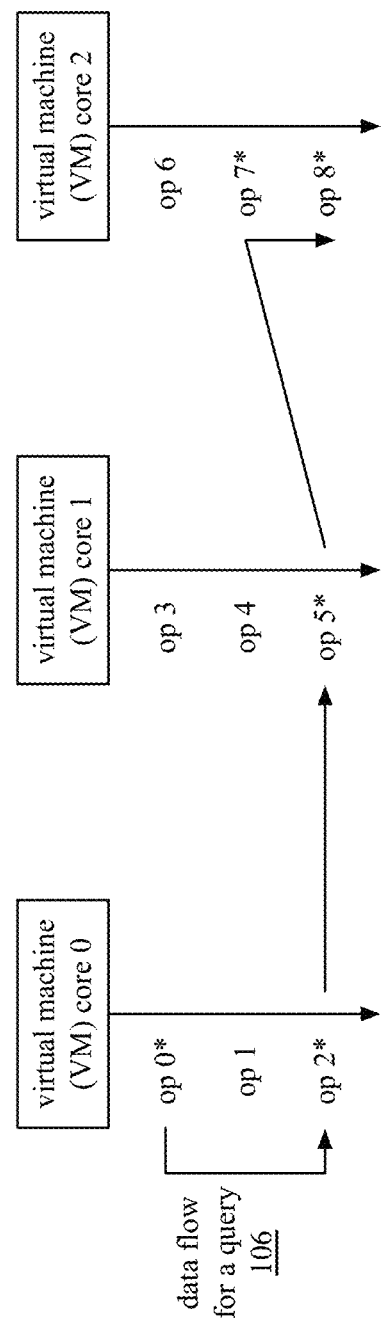
FIG. 17 is a schematic block diagram of an example of data flow via operations being executed by virtual machines of one or more processing core resources in accordance with the present invention.

FIG. 17 is a schematic block diagram of an example of data flow for a query 106 via operations being executed by virtual machines 0-2 of one or more processing core resources. In this example, VM core 0 is responsible for executing operation 0 (op 0), op 1, and op 2; VM core 1 is responsible for executing op 3, op 4, and op 5; and VM core 2 is response for executing op 6, op 7, and op 8. For this example, the operation may be any of the operations of the database instruction set and the suffix number is used to indicate that the operations are separate operations. Operations 0, 2, 5, 7, and 8 are related for a query and represent data flow for execution of these operations for the given data flow for a query 106.

Figure 18:
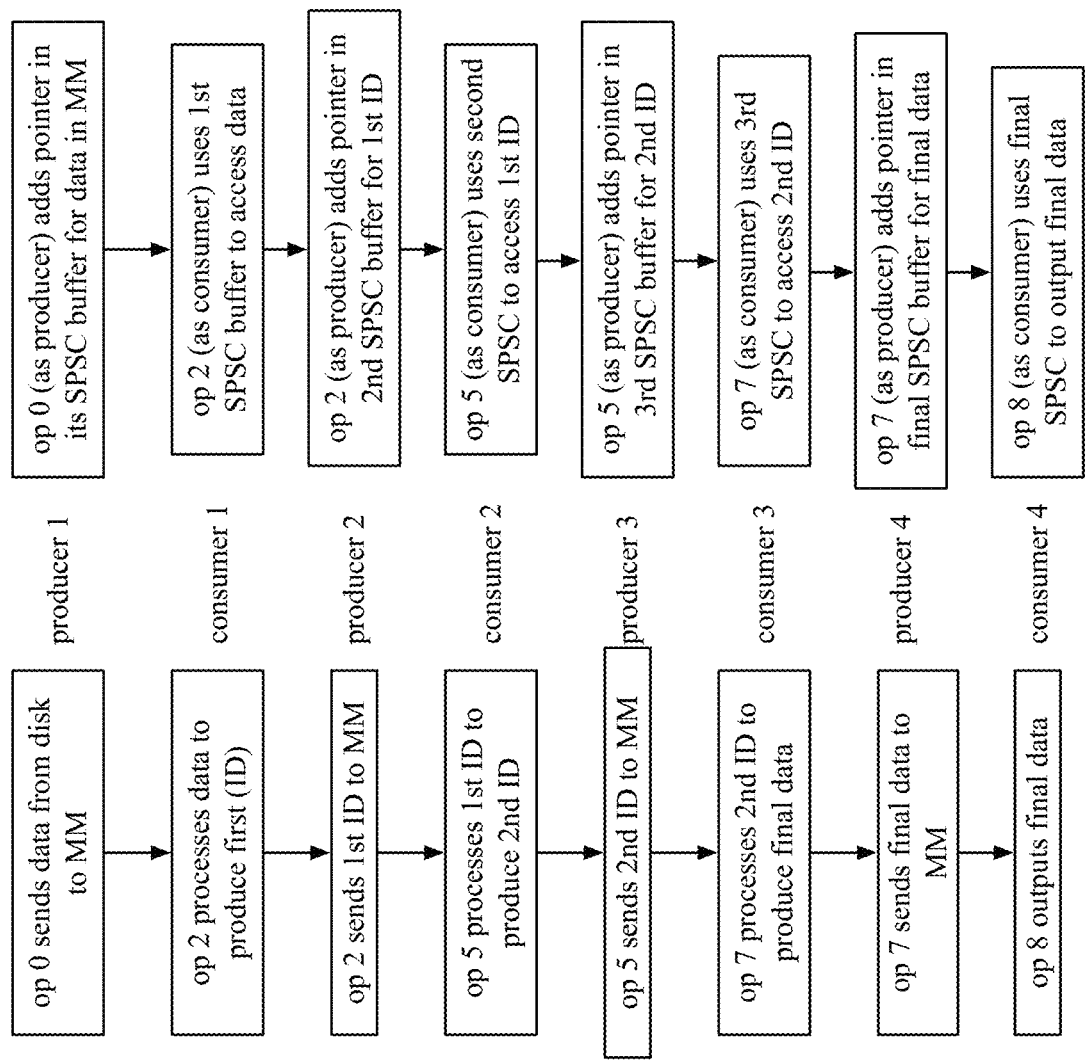
FIG. 18 is a logic diagram of an example of data flow of FIG. 90 between virtual machines of one or more processing core resources using the SPSC buffers in accordance with the present invention.

FIG. 18 is a logic diagram of an example of data flow of FIG. 17 between virtual machines of one or more processing core resources using the SPSC buffers. As shown in FIG. 18, the operational flow of data is from op 0 to op 2, to op 5, to op 7, and then to op 8. Starting with op 0 of the left flow diagram, assume that it is a read request to read data from a memory device and place it in allocated memory of the main memory. The VM core 0, which is executing op 0, performs the operation of reading the requested data from a memory device and placing it into the allocated memory. In addition, as a producer, it adds a pointer into its own SPCS buffer, since it also performs the next operation in the sequence.

As the consumer, VM core 0 accesses the SPSC buffer to retrieve the pointer for the data stored in the allocated memory of the main memory. VM core 0 then accesses the data from the allocated memory and performs op 2 on the data to produce a first intermediate data (ID). The VM core 0 then writes the first ID into the allocated memory of the main memory. As a producer, VM core 0 writes a pointer to the first ID on the allocated memory into a SPSC with VM core 1, which is responsible for the next operation (e.g., op 5).

As the consumer, VM core 1 accesses the SPSC buffer to retrieve the pointer for the first ID stored in the allocated memory of the main memory. VM core 1 then accesses the first ID from the allocated memory and performs op 5 on the data to produce a second intermediate data (ID). The VM core 1 then writes the second ID into the allocated memory of the main memory. As a producer, VM core 1 writes a pointer to the second ID on the allocated memory into a SPSC with VM core 2, which is responsible for the next operation (e.g., op 7).

As the consumer, VM core 2 accesses the SPSC buffer to retrieve the pointer for the second ID stored in the allocated memory of the main memory. VM core 2 then accesses the second ID from the allocated memory and performs op 8 on the data to produce a final data for this operation sequence. The VM core 2 then writes the final data into the allocated memory of the main memory. As a producer, VM core 2 writes a pointer to the final data on the allocated memory into a SPSC with another VM core that is responsible for outputting the final data. Alternatively, VM core 2 outputs the final data without updating an SPSC buffer.

Figure 19:
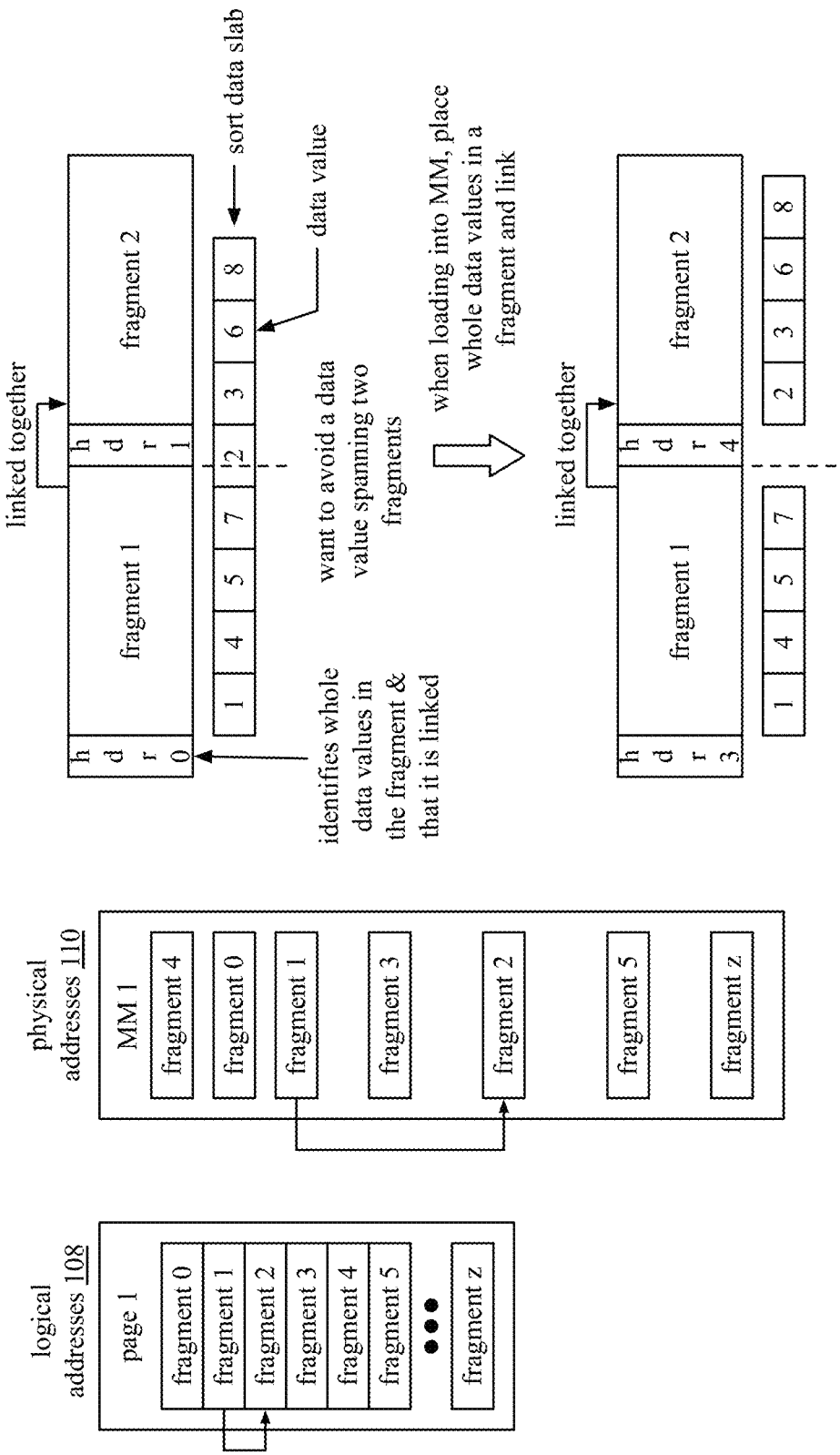
FIG. 19 is a schematic block diagram of an example of linking fragments in separate physical memory spaces based on fragments of a page in logical address space in accordance with the present invention.

FIG. 19 is a schematic block diagram of an example of linking fragments in separate physical memory addresses 110 (spaces) based on fragments of a page in logical addresses 108 (spaces). In this example, the fragments of a page (0-z) are sequential in logical address space. In physical address space, however, the fragments are not sequential and very often not contiguous.

Each fragment includes a header section 0-1 or 3-4 that includes a count of the number of whole data values in the fragment and information as to whether it is linked to one or more other fragments. Fragments are linked together for temporary storage in allocated memory of the DB memory space of the main memory when a data value spans two fragments. The size of data values ranges from a byte to 1 M Byte or more.

In the example, data value "2" spans the first and second fragments (e.g., as depicted with headers 1 and 2). Accordingly, the fragments 1 and 2 are linked together when a page, or a relevant portion thereof, is to be written to the allocated memory. With fragments 1 and 2 linked together, when they are written into the allocated memory, they will be contiguous (e.g., as depicted with headers 3 and 4). Thus, data value "2" is contiguous in the allocated memory.

Figure 20:
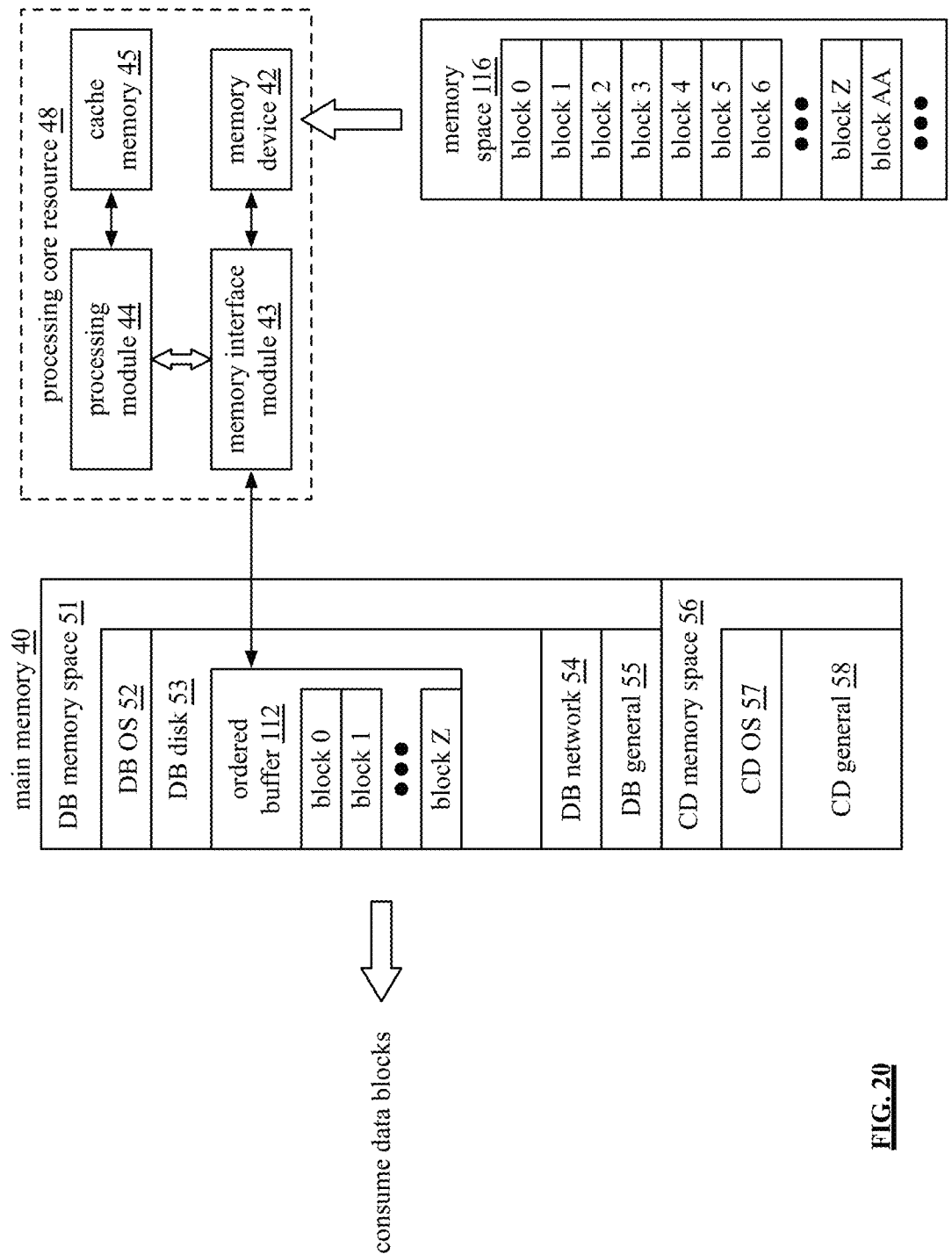
FIG. 20 is a schematic block diagram of an example of a read operation to read data from memory space of a non-volatile memory device into an allocated buffer of main memory in accordance with the present invention.

FIG. 20 is a schematic block diagram of an example of a processing core resource 48 executing a read operation to read data from memory space 116 of a (non-volatile) memory device 42 into an ordered buffer 112 of main memory 40. The processing core resource 48 includes a processing module 44, cache memory 45, a memory interface module 43, and memory device(s) 42 as previously discussed. The memory device 42 stores data in a memory space 116 in data blocks. Each data block is of a fixed size (e.g., logical blocks having a size of 4 K Bytes). When data is read from the memory device 42 and subsequently written into the ordered buffer 112 of the main memory 40, it is desirable to so with as minimal amount of reads as possible and to maintain the order of the data in the ordered buffer 112.

In an example, data of interest is stored as data blocks 0-Z, which may be data from a segment of a segment group of a partition of a table in the memory device(s) 42. In general, the data blocks are stored in an order; block 0 being the first and block Z being the last. When read operations for the data blocks are made, they are made in order; read operation for block 0 is first and read operation for block Z is last. The read operations are sent to the non-volatile memory in the order created, however, the non-volatile memory does not respond to the read operations in the order sent due to the general operations of non-volatile memories.

The ordering of the data blocks is important for processing of them (i.e., consumption of the data block). As such, it is desirable to store the data blocks in the buffer of main memory 40 in the desired order and not in the order the non-volatile memory responded to the read operations.

Figure 21:
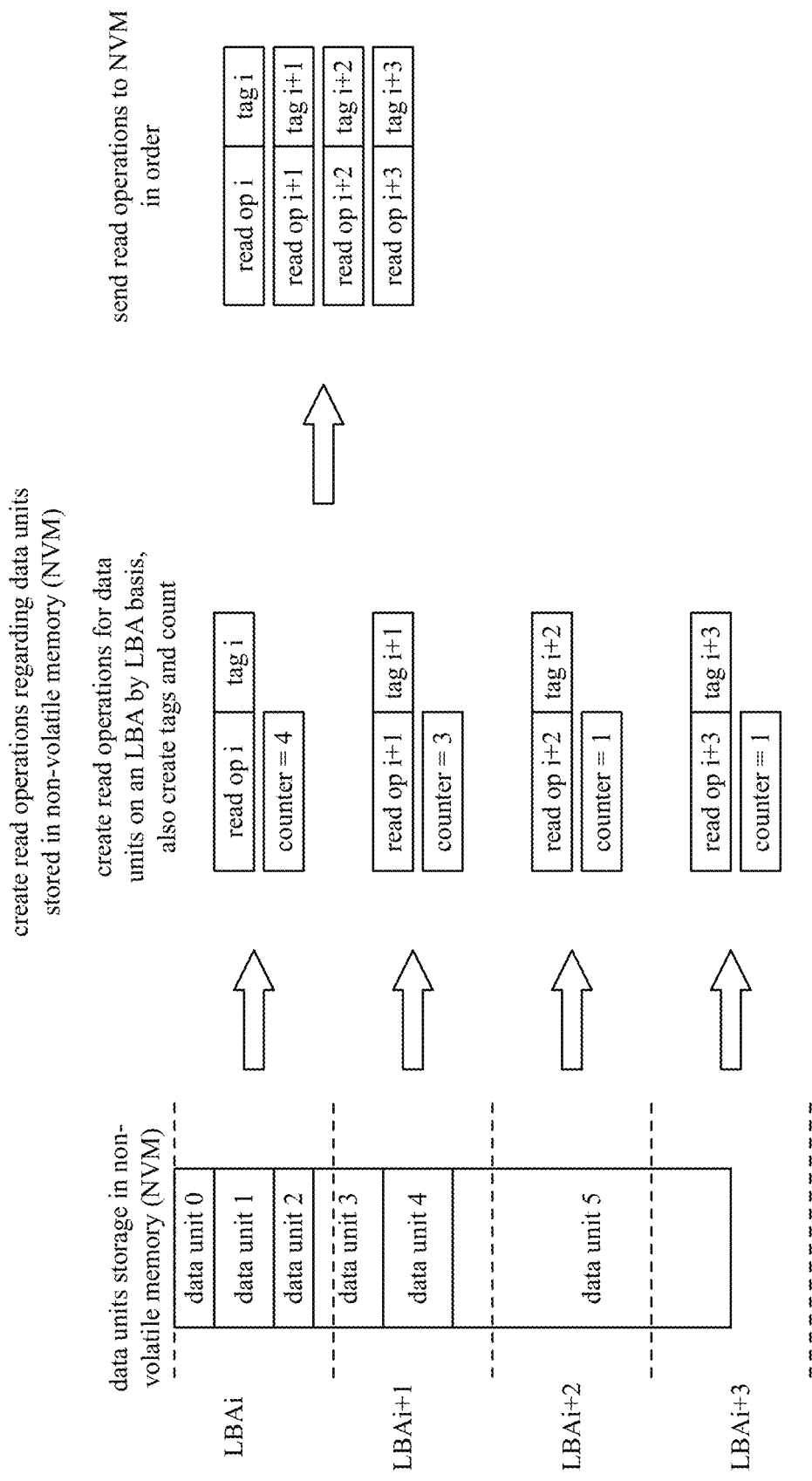
FIG. 21 is a schematic block diagram of another example of a read operation to read data from memory space of a non-volatile memory device into an allocated buffer of main memory based on logical block addresses (LBA) in accordance with the present invention.

FIG. 21 is a schematic block diagram of another example of a processing entity (e.g., one or more processing core resources of a computing device, one or more nodes of the computing device, one or more processing core resources of another computing device, and/or one or more nodes of the other computing device) executing a read operation to read data from non-volatile memory device (e.g., memory space 116) for data units 0-5. Data units 0-5, which are generally not of a fixed size, are stored in logic blocks LBAi, LBAi+1, LBAi+2, LBAi+3, which are of a fixed size. Read operations are created to read data units 0-5, but on a logic block level.

For example, a read operation is created for logic block LBAi, which contains all of data units 0-2 and part of data unit 3. While creating the read operation for LBAi, the processing entity also creates a unique tag value for the read operation and creates a counter value. The unique tag value uniquely identifies LBAi for this read operation and is used to identify the response from the non-volatile memory. The counter value reflects the number of data units that are fully contained in the data block and that are partially contained in the data block. For this example, LBAi has three full data units (0-2) and one partial data unit (3), thus the counter value is 4.

The processing entity also creates read operations for logic blocks LBAi+1, LBAi+2, LBAi+3, which includes corresponding unique tag values and counter values. For example, the processing entity creates a read operation for logic block LBAi+1, which includes unique tag ID (tag i+1) and a counter value of 3 for the data units (3-5) at least partially contained in the logic block. As another example, the processing entity creates a read operation for logic block LBAi+2, which includes unique tag ID (tag i+2) and a counter value of 1 for data unit 5, which spans the entire logic block. As yet another example, the processing entity creates a read operation for logic block LBAi+3, which includes unique tag ID (tag i+3) and a counter value of 1 for data unit 5, which spans a portion of the logic block. The processing entity sends the read operations and their corresponding tags to the non-volatile memory.

Figure 21A:
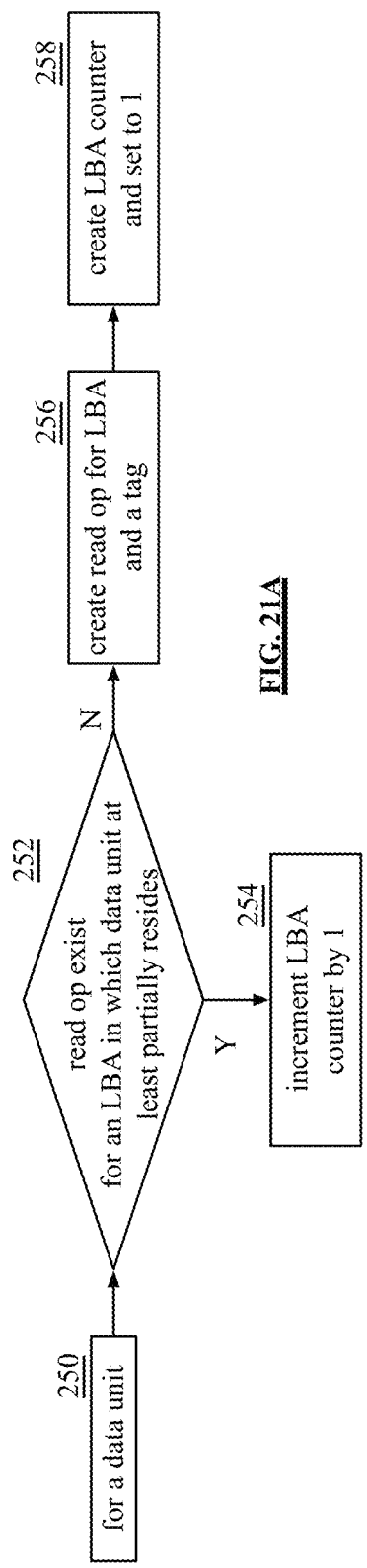
FIG. 21A is a logic diagram of an example of a method for creating a tagged read operation in accordance with the present invention.

FIG. 21A is a logic diagram of an example of a method for creating a tagged read operation by a processing entity. The method begins at step 250 where the processing entity identifies a data unit that is to be read from non-volatile memory. The method continues at step 252 where the processing entity determines whether a read operation exists for the logic block of the non-volatile memory in which the data unit is stored. If yes, the method continues at step 254 where the processing entity increments the counter value for the logic block. The method then repeats for the next data unit to be read or ends when all data units that are to be read have been processed in this manner.

When a read operation does not exist for the data unit, the method continues at step 256 where the processing entity creates a read operation for the logic block and creates a unique tag value for the logic block. The method continues to step 258 where the processing entity creates a counter value for the logic block and sets it to 1 (for the data unit). The method then repeats for the next data unit to be read or ends when all data units that are to be read have been processed in this manner.

Figure 21B:
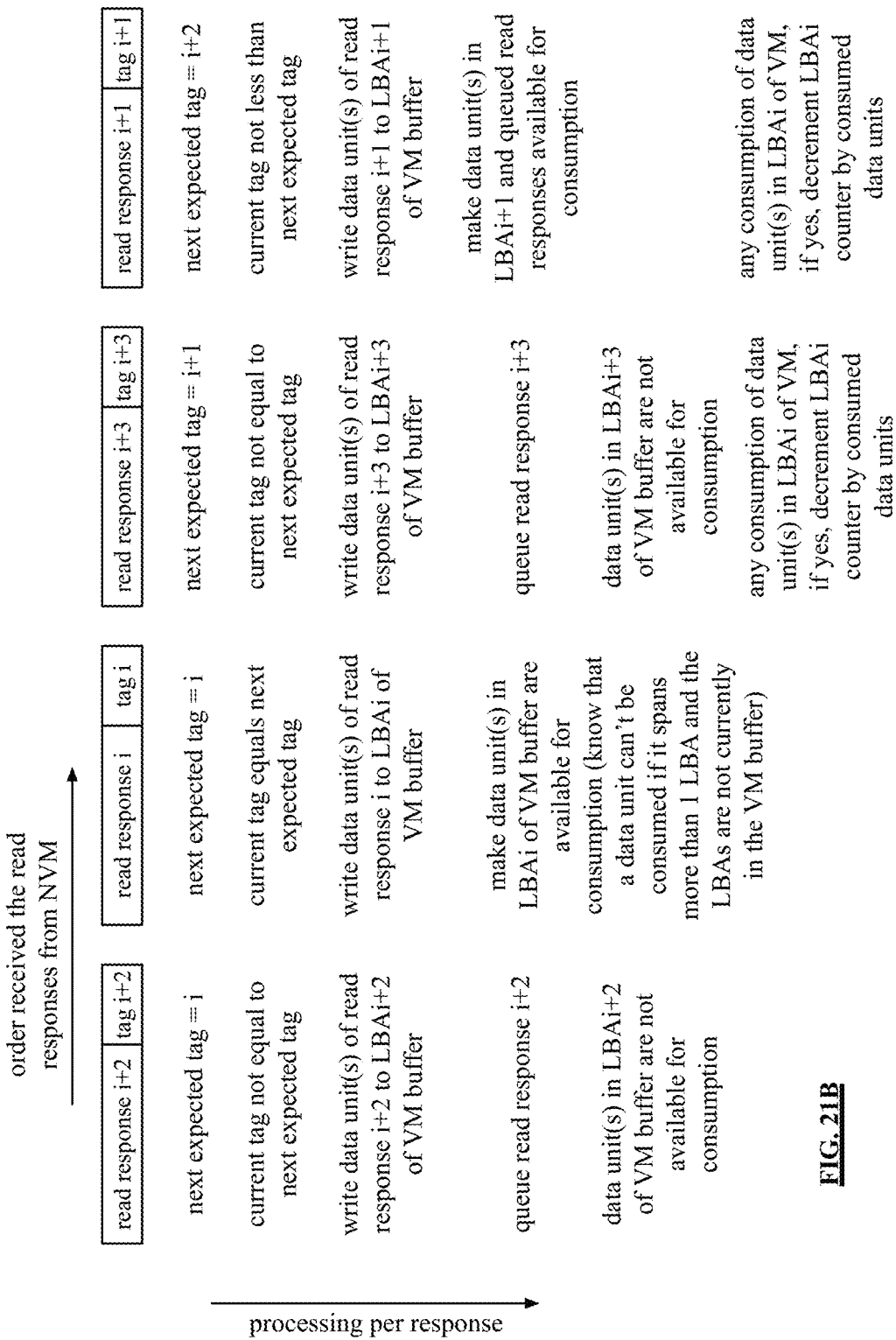
FIG. 21B is a diagram of an example of a processing tagged read operations in accordance with the present invention.

FIG. 21B is a diagram of an example of processing tagged read operations of FIG. 21 by a processing entity. As discussed above, the processing entity sends the tagged read operations in the order corresponding to the order of the logic blocks: LBAi read operation first, LBAi+1 read operation second, and so on. The non-volatile memory, however, does not typically process read operations in the order they were sent, but in a more random order. For this example, the non-volatile memory responded to the read operation for LBAi+2 first, then to the read operation for LBAi, then to the read operation for LBAi+3, and finally to the read operation for LBAi+1.

After sending the read operations to the non-volatile memory, the processing entity sets a flag for the next expected tag. The next expected tag corresponds to the next logic block in the order of logic blocks that have been received. In the first column of the example, the next expected tag is set to "i", which is the tag for the read operation for logic block LBAi (the first logic block in the order).

The non-volatile memory, however, provides a read response i+2 (which includes tag i+2) to the read operation for logic block BLAi+2. In this instance, the process entity keeps the next expected tag set to "i", since it has not yet received the response to the read operation for logic block LBAi. Since the current tag is not equal to the next expected tag, the processing entity writes the data unit(s) of the current data block (e.g., LBAi+2) into LBAi+2 position of a virtual machine (VM) buffer (i.e., the ordered buffer 112 of FIG. 20). In addition, the processing entity queues the tag i+2. Note that data units of LBAi+2 are not made available for consumption at this time.

The next response from the non-volatile memory is read response i (with tag i) for the read operation for logic block LBAi. In this instance, the read response tag matches the next expected tag of i. As such, the processing entity writes the content of read response i (i.e., the data unit(s) stored in LBAi) into position LBAi of the VM buffer and makes the whole data units available of consumption. The processing entity adjusts the next expected tag to i+1 and checks to see if the next expected tag has been queued. In this case, it hasn't. Note that a partial data unit of a logic block is not made available for consumption until it is fully stored in order in the VM buffer. Further note that the data units of LBAi+2 are still not available for consumption.

The non-volatile memory next provides read response i+3 (with tag i+3) for read operation for logic block LBAi+3. Since the next expected tag is i+1, the tags do not match. Thus, the processing entity stores the content of the read response for the LBAi+3 in the LBAi+3 position of the VM buffer, but does not make the content (i.e., the data unit, or units) available for consumption. In addition, the processing entity queues the tag i+3. During this time, data units stored in the LBAi section of the VM buffer may have been consumed (e.g., retrieved for processing). If so, the counter value is decremented by the number of data units that have been consumed. When the counter value reaches zero, the logic block position of the VM buffer is released.

This example continues with the non-volatile memory providing read response i+1 (with tag i+1) to read operation LBAi+1. Since this tag matches the next expected tag, the processing entity stores the content read response i+1 in LBAi+1 position of the VM buffer and makes the content (e.g., the hole data units of LBAi) available for consumption. The processing entity then updates the next expected tag to i+2 and checks the queue for i+2. Since the queue includes i+2, the processing entity makes the contents of LBAi+2 available for consumption, updates the next expected tag to i+3, and checks the queue.

Since the queue includes i+3, the processing entity makes the contents of LBAi+3 available for consumption. At this point, all of the data units are available for consumption. As the data units are consumed from the logic blocks, the counters of the logic blocks are decremented. When a logic block counter reaches zero, the logic block location in the VM buffer is released. This allows for ordering to be maintained despite out of order responses by the non-volatile memory, which increases efficiency and parallelism of processing data for a query.

FIGS. 22 and 22A are a logic diagram of an example of a method for creating tagged read operations and processing responses thereto by a processing entity. The method begins at step 260 of FIG. 22 where the processing entity identifies data units to read from non-volatile memory and to write them into ordered buffers of volatile memory. The volatile memory includes random access memory and the non-volatile memory including one or more of a solid-state memory device and a disk memory device. The data units have a variety of data sizes and are stored in "n" number of logical data blocks of the non-volatile memory, wherein "n" is an integer greater than or equal to two. In this example, at least one data unit is stored in two or more logical data blocks (e.g., data unit 3 of FIG. 21). Also in this example, the logical data blocks storing the data units are contiguous (e.g., have logical addresses that are contiguous), yet the physical memory locations of logic blocks in the disk memory are not contiguous.

In one example, the processing entity identifies the data units by receiving an operation that includes reading the data units from the disk memory and writing the plurality of data units into the ordered buffer. In another example, the processing entity accessing metadata regarding the plurality of data units to read to determine the logic blocks to read from the disk memory. The processing entity uses the number of logic blocks to read to create an ordered buffer in the volatile main memory. Note that, in an embodiment, creating the ordered buffer is done in accordance with a process specific operating system of the computing device and that the process specific operating system overrides, with respect to the volatile main memory, a general operating system of the computing device.

The method continues at step 262 where the processing entity generates "n" number of read operations regarding the plurality of data units (i.e., one for each logic block to be read). In addition, the processing entity determines a unique data unit count value (e.g., counter value) for each read operation. The unique data unit count value indicates a number of data units that are at least partially stored within a corresponding logical data block (e.g., logic block). The counter value is used to determine when the logic block in the volatile main memory can be released. For instance, the processing entity tracks when a data unit of a logic block of the volatile main memory is consumed. When a data unit is consumed, the counter value is decremented. When the counter value reaches zero, the logic block position of the ordered buffer is released.

The method continues at step 264 where the processing entity tags each read operation with a unique ordered tag value. As an example, a first read operation is regarding a first logical data block of the "n" number of logical data blocks of the non-volatile memory and is tagged with a first ordered tag value. The processing entity sends the read operations with their corresponding tags to the non-volatile memory.

The method continues at step 266 where the processing entity receives read responses to the read operations from the non-volatile memory. For example, a first read response is received in response to the first read operation and includes the first ordered tag value.

The method continues at step 268 where the processing entity writes data units contained in the read responses into the ordered buffers in accordance with the ordered tag values. This step will be further described with reference to FIG. 22A. The method continues at step 270 where the processing entity tracks consumption of the data units from the ordered buffers using the counter values.

FIG. 22A expands on the method of FIG. 22 and begins at step 280 where the processing entity compares an order tag value of a current received read response of the read responses with a next expected tag value. The method branches at step 282 based on whether the comparison of step 280 was favorable or not. When the comparison was not favorable, the method continues at step 284 where the processing entity queues the tag of the read response and stores the contents of the logic block in its appropriate place in the ordered buffer, but the contents are not made available for consumption.

When the comparison is favorable, the method continues at step 286 where the processing entity writes the one or more partial data units contained in the current received read response to one of the ordered buffers based on the ordered data tag. The method continues at step 288 where the processing entity increments the next expected tag value. An example of processing the read responses in view of tags and queued tags was provided with reference to FIG. 21B.

Figure 23:
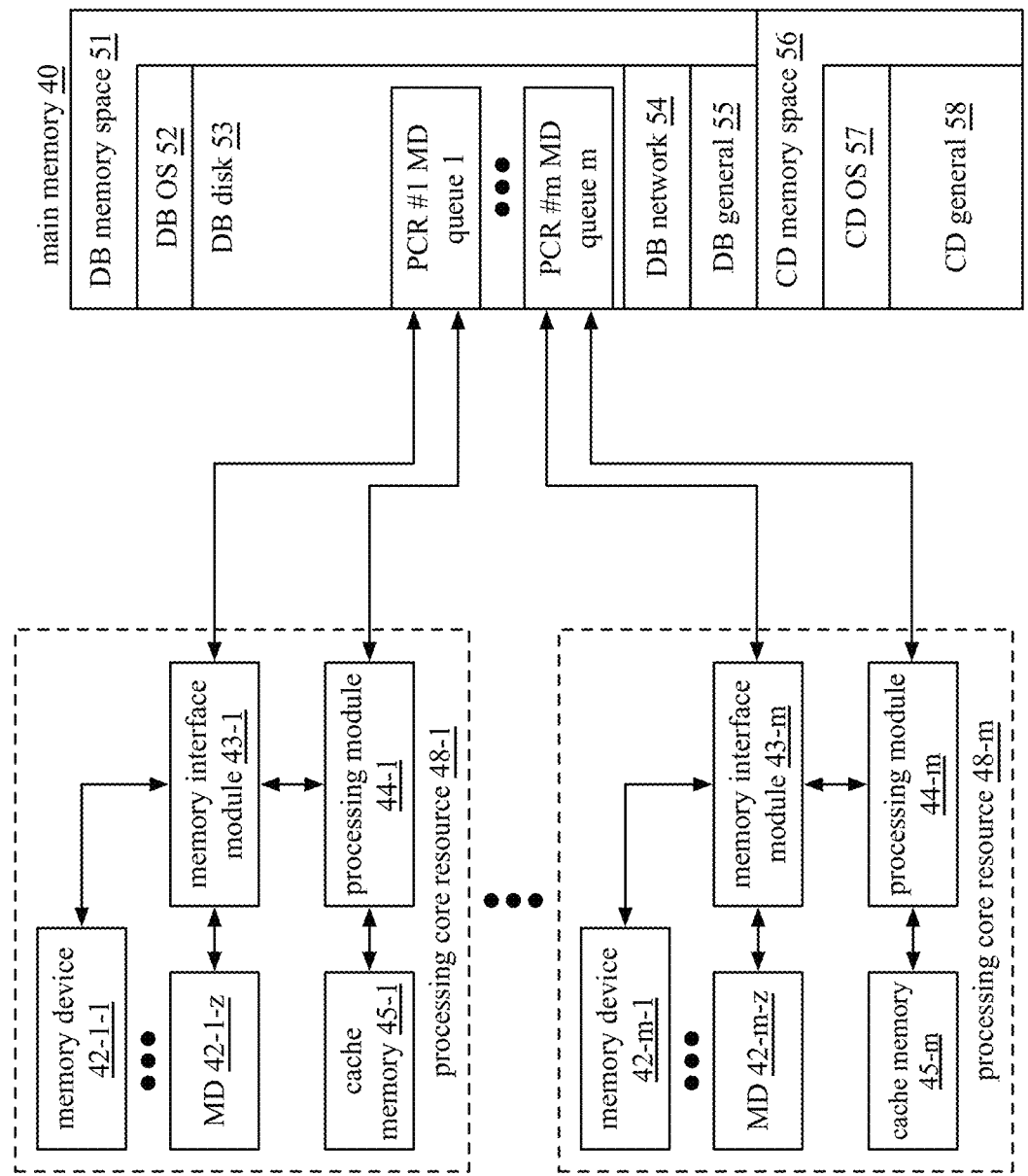
FIG. 23 is a schematic block diagram of an example of memory device (MD) buffer queues being allocated to memory devices of processing core resources of a node of a computing device in accordance with the present invention.

FIG. 23 is a schematic block diagram of an example of memory device (MD) buffer queues 1-m being allocated to memory devices 42 of processing core resources 48 of a node of a computing device. Under the control of the database operating system, the main memory 40 of a computing device is divided into a database (DB) memory space 51 and a computing device (CD) memory space 56. The DB memory space 51 is generally and dynamically divided into a DB disk section 53, a DB network section 54, and/or a DB general section 55 as previously discussed. Each of the sections may be further dynamically divided into buffers, queues, or other forms of temporary data storage containers. For the purposes of this figure, dynamically divided means that, in accordance with the DB operating system, a portion of the DB memory space is allocated to a node, a processing core resource (PCR), operation, and/or thread on an as needed basis.

In this example, queues are allocated to the memory devices of the processing core resources (PCR) of a node. As a specific example, the memory device (which includes one or more solid state non-volatile memory devices) of PRC 48-1 is allocated a queue called PCR #1 MD queue 1. The processing module of PCR 48-1 can write data into and read data from PCR #1 MD queue 1. The processing modules 44 of the other processing core resources can read data from PCR #1 MD queue. In an embodiment, processing module 44-*m* of processing core resource 48-*n* can write data to the PCR #1 MD queue 1.

As a specific example, the memory device 42-*m*-1 (which includes one or more solid state non-volatile memory devices) of PRC 48-*m* is allocated a queue called PCR #*m* MD queue m. The processing module 44-*m* of PCR 48-*m* can write data into and read data from PCR #*m* MD queue m. The processing modules 44 of the other processing core resources can read data from PCR #*m* MD queue m. In an embodiment, processing module 44-1 of processing core resource 48-1 can write data to PCR #*m* MD queue m.

Data is written into and read from the PCR memory device (MD) queues in a format and/or data word size that corresponds to the format and/or data word size of the memory devices. For example, data is stored as pages (i.e., a contiguous block of physical memory) in the memory devices. Accordingly, data is stored in the MD queues in the same sized pages (e.g., 4 Kbytes). By using the same size, the memory interface modules of the processing core resources can directly access the PCR MD queues. In this manner, the queues are pinned memory and improves read and write efficiencies between the memory devices of the processing core resources and main memory by eliminating reads and writes having to be processed by the processing module of the processing core resources. Such processing typically included a format change (e.g., a data size change from one data size to another).

Figure 24:
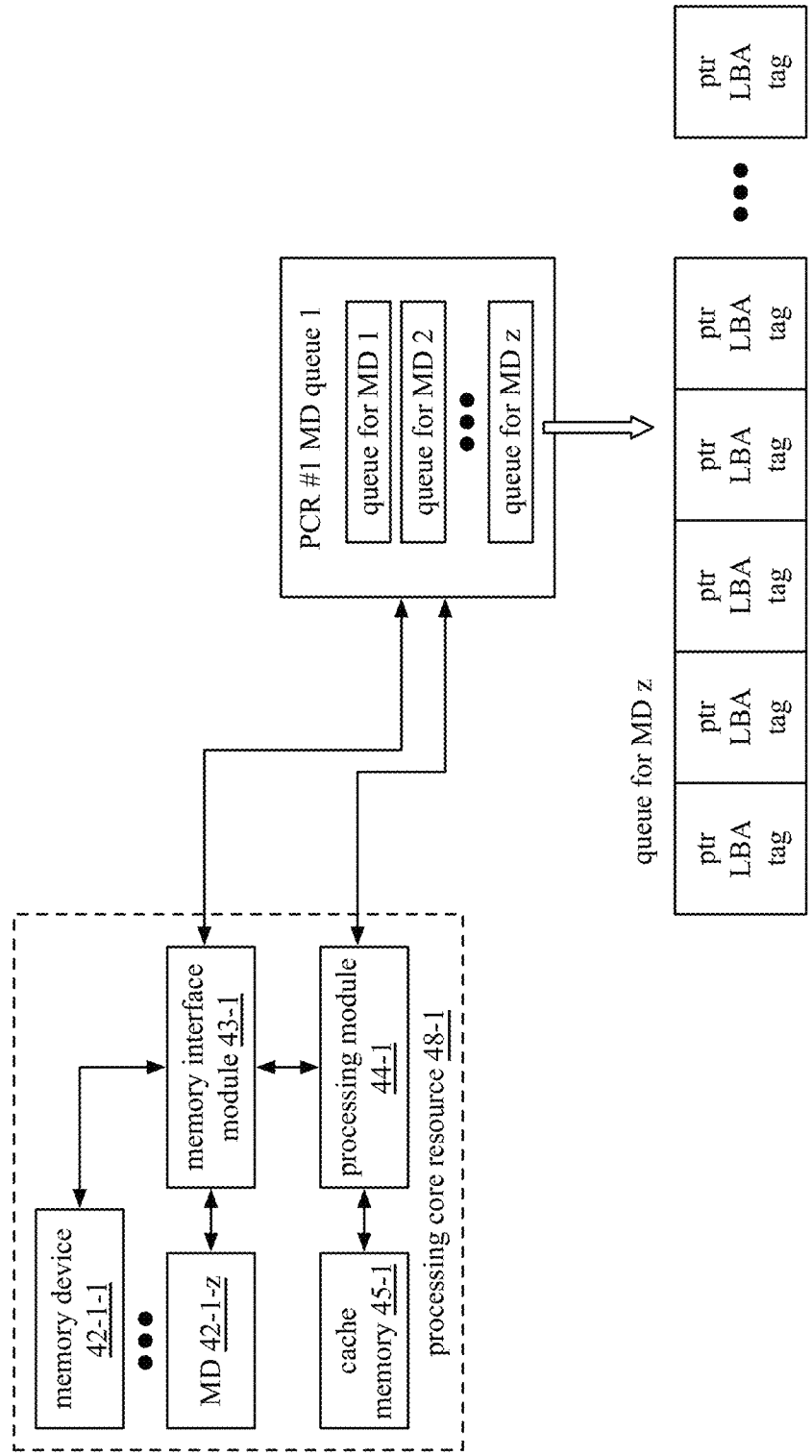
FIG. 24 is a schematic block diagram of an example of a memory device (MD) buffer queue having separate queues for each memory device of a processing core resource of a node of a computing device and the formatting of the separate queues in accordance with the present invention.

FIG. 24 is a schematic block diagram of an example of a memory device (MD) buffer queue having separate queues 1-z for each memory device of a processing core resource 48 of a node 37 of a computing device 18 and the formatting of the separate queues. This example is a continuation of the example of FIG. 23, which includes processing core resource 48-1 and PCR #1 MD queue 1. The queue is divided into separate queues for each physical memory device (1 -z) of the processing core resource 48-1. Each individual memory device queue (e.g., queue for MD #z) is divided into fields. Each field of a queue includes a pointer (ptr), a logical block address (LBA), and a tag. The pointer points to a physical memory space in the particular memory device (e.g., memory device z) and the LBA is the logical block address for the data of where it is stored in virtual memory space. The tag is a tracking number that corresponds to when an input or output request was made for the data at the LBA.

Entry into a memory device queue is separate and asynchronous from executing an operation regarding the data identified in the field of the queue. For example, when a read request is received for data at LBA xxx, it is tagged with a number, the physical address is determined, and the information is entered into a field of the queue. That completes this process and the operation requesting the read cannot now delete the information from the queue. At some later time, the read request will be processed and the queue cleared.

The physical processing of a read requests is typically not done in the same order as the read requests were received. The read request order, however, is important to ensure that operations flow in a desired order and deadlocks are avoided. The present queue processing allows for out of order read processing while maintain read request ordering. An example of this is provided with reference to FIGS. 25-29.

Figure 25:
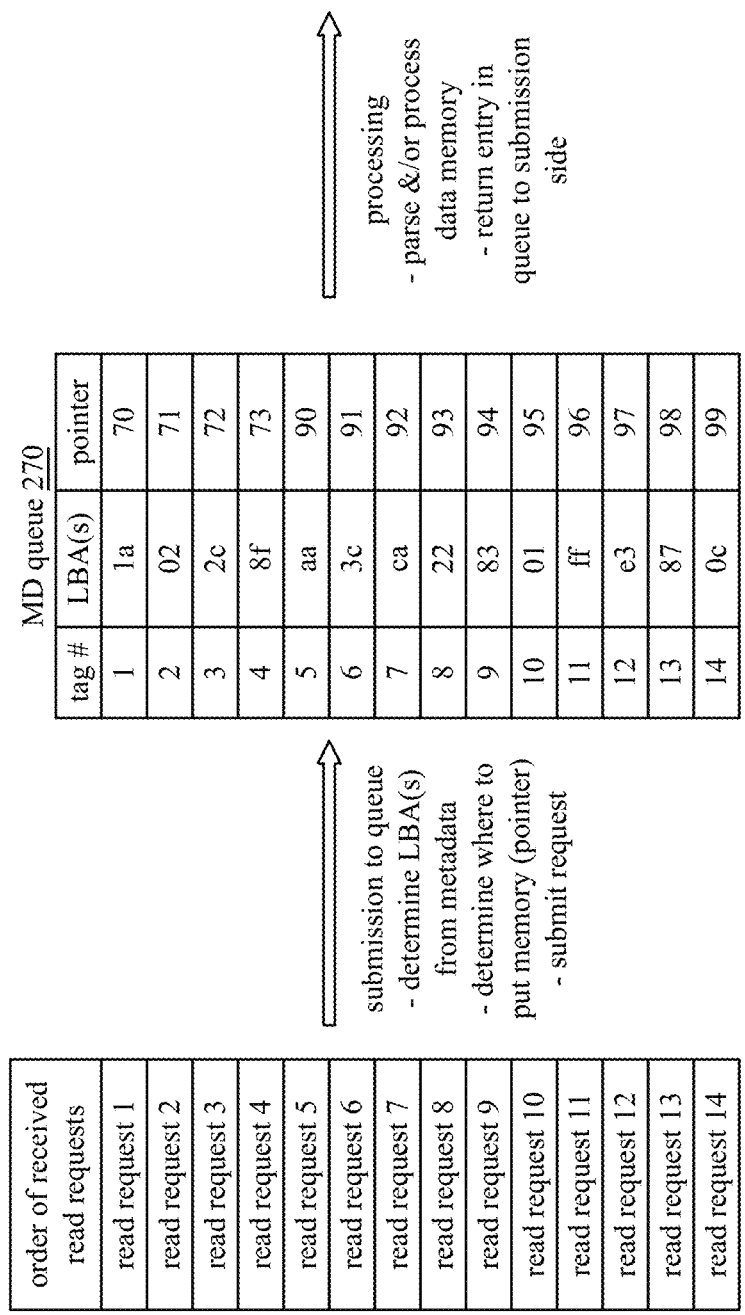
FIG. 25 is a schematic block diagram of an example of read requests being received in an order for a memory device and information regarding the read requests being entered into memory device's queue in accordance with the present invention.

FIG. 25 is a schematic block diagram of an example of read requests being received in an order for a memory device of a processing core resource and information regarding the read requests being entered into memory device's queue 270. In this example, 14 read requests have been received in a short time frame (too short to individually process the read request before the next one comes in). Each read request is added to the MD queue. For example, read request 1 is tagged with tag #1, its LBA is added to the LBA portion of the first field, and the pointer to the physical memory is added in its portion of the field. The other read requests are similarly added to the MD queue.

The read requests may be from the same processing core resource, from different processing core resources of the same node, and/or from processing core resources of different nodes of a computing device. As the read requests are entered (i.e., submitted) into the queue, processing of them begins. The processing includes parsing and/or process data memory, return an entry in the queue to the submission side.

Figure 26:
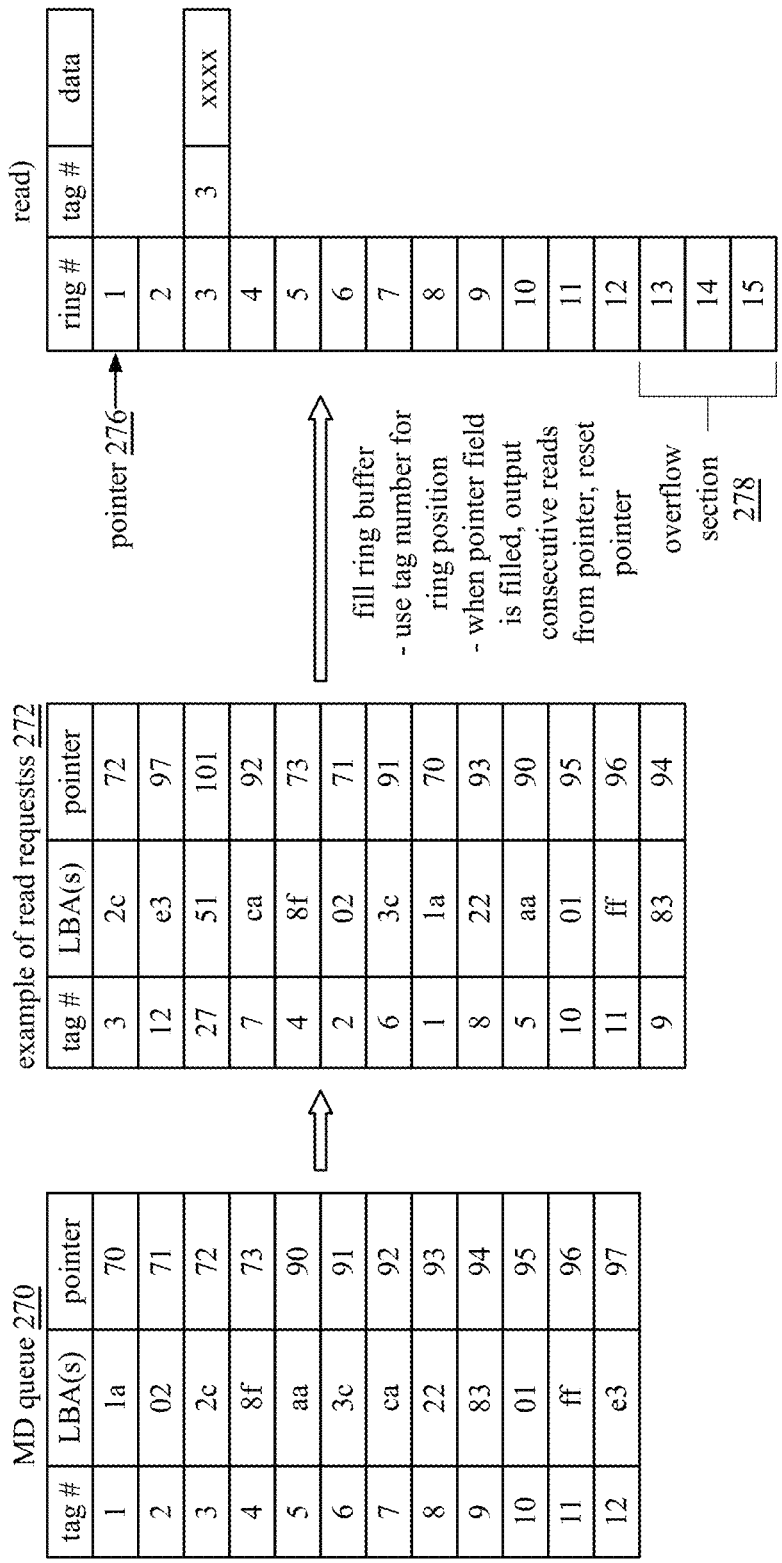
FIG. 26 is a schematic block diagram of an example of read requests being processed out of the order in which they were received, the corresponding information in the memory device queue being entered into a ring buffer as the requested are being processed, and positioned in the ring buffer based on tags in accordance with the present invention.

FIG. 26 is a schematic block diagram of an example of read requests 272 being processed out of the order in which they were received, the corresponding information in the memory device queue 270 being entered into a ring buffer 274 as the requests are being processed, and positioned in the ring buffer based on tags. In this example, the order in which the read requests are actually processed is shown in the middle table (example processed reads). In this example, read request #3 is the first to be processed and added to a ring buffer in position #3.

The ring buffer is pre-sized to temporarily hold read requests until at least a partial ordered portion of the read requests have been processed. The ring buffer further includes an overflow section 278 to temporarily hold processed read requests that are processed fairly significantly out of the order in which they were requested.

The ring buffer 274 includes a pointer 276 that points to the ring buffer location corresponding to the first read request in the MD queue (e.g., with the tag of #1). In the ring buffer, as long as the first space is empty, a consecutive order of completed read requests. Thus, at this stage of processing read requests, nothing is outputted.

Figure 27:
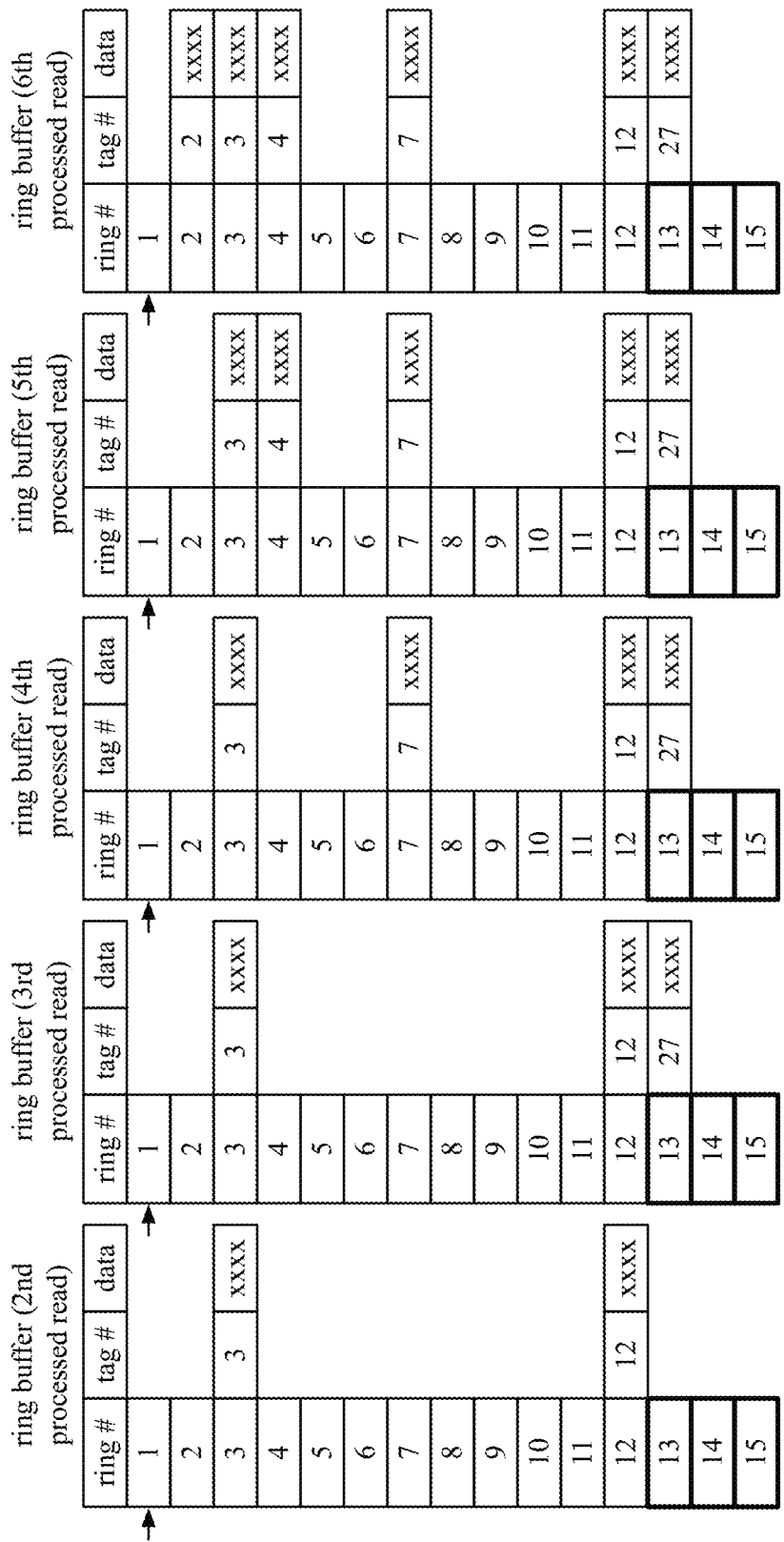
FIGS. 27-29 are schematic block diagrams of an example of filling up the ring buffer of FIG. 26 and outputting read data in a sequenced order in accordance with the present invention.

FIG. 27 illustrates the processing of the next five completed read requests. The second processed read request is for the received read request #12. The processed read request is added to position 12 in the ring buffer. The pointer stays pointing a ring #1. The third processed read request is for the received read request #27. Since this read request is significantly out of order for a ring buffer having 12 entries, it is placed in the overflow section. In particular, it is placed in position 13 of the ring buffer.

The fourth processed read request is for the received read request #7. The processed read request is added to position 7 in the ring buffer. The fifth processed read request is for the received read request #4. The processed read request is added to position 4 in the ring buffer. The sixth processed read request is for the received read request 12. The processed read request is added to position 2 in the ring buffer. At this point in time, position 1 is still empty and the pointer continues to point to it.

Figure 28:
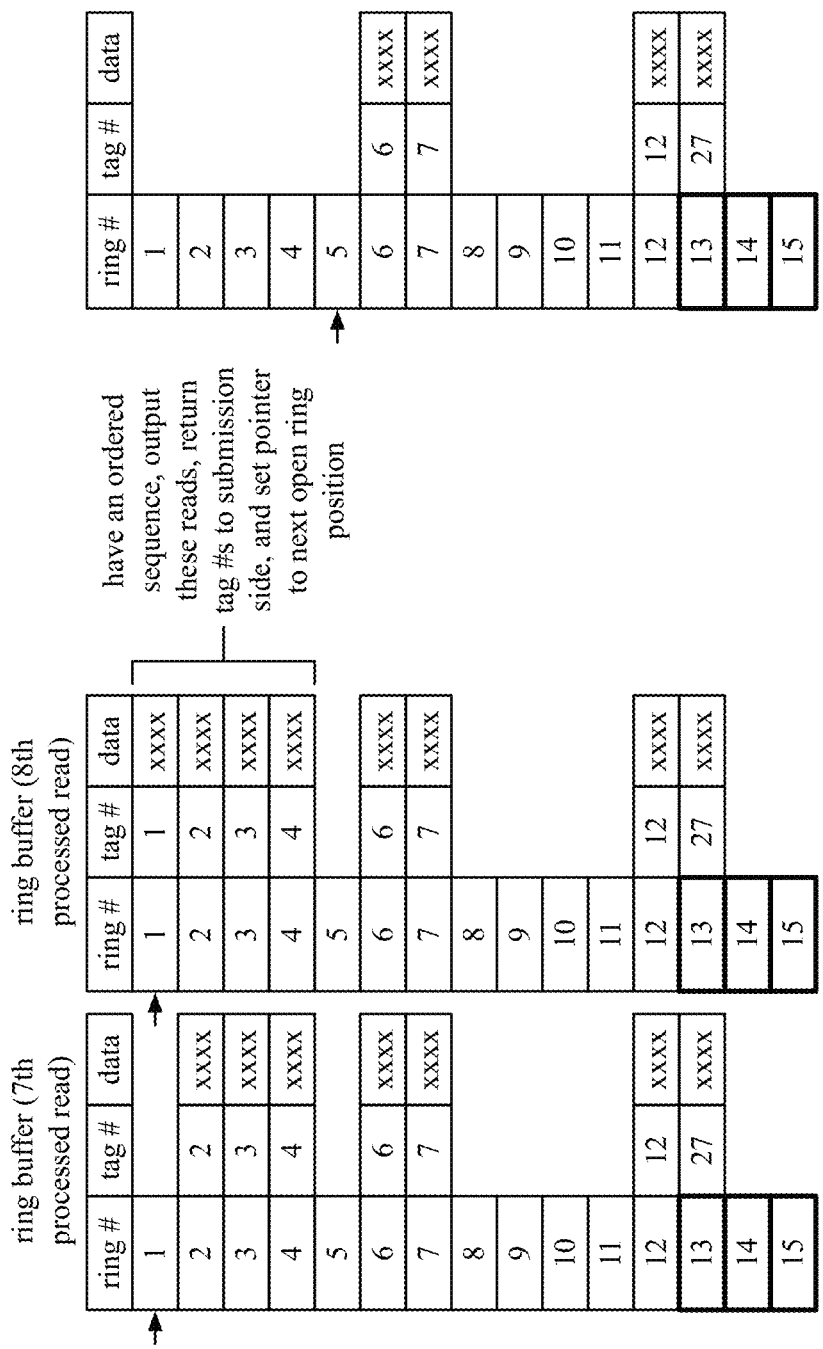

FIG. 28 illustrates the processing of the next two completed read requests. The seventh processed read request is for the received read request #6. The processed read request is added to position 6 in the ring buffer. The pointer stays pointing a ring #1. The eighth processed read request is for the received read request #1. The processed read request is added to position 1 in the ring buffer. At this point in time, the pointer is now pointing to a non-empty field. With the pointer pointing to a non-empty field, the pointer field and every consecutive field that is not empty has the corresponding read operation completed.

In this example, the first four entries in the ring buffer are not empty. So, the read requests having tag numbers 1-4 are outputted. Once the data is outputted (i.e., read by the requesting entity), the pointer is moved to the next empty location. Position 5 in this example. In addition, positions 1-4 are released and are now at the end of the ring buffer.

Figure 29:
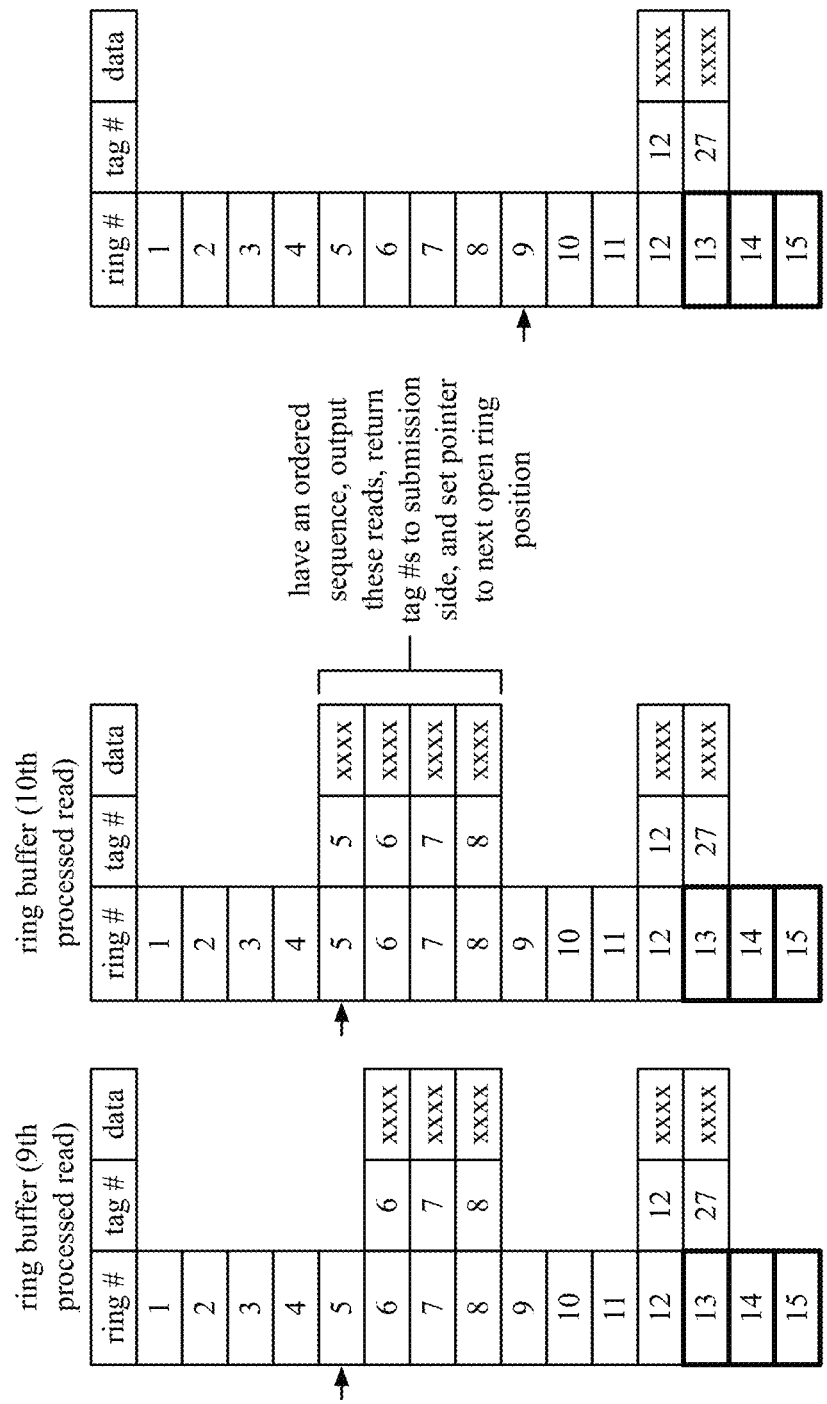

FIG. 29 illustrates the processing of the next two completed read requests. The ninth processed read request is for the received read request #8. The processed read request is added to position 9 in the ring buffer. The pointer stays pointing a ring #5. The tenth processed read request is for the received read request #5. The processed read request is added to position 5 in the ring buffer. At this point in time, the pointer is now pointing to a non-empty field. With the pointer pointing to a non-empty field, the pointer field and every consecutive field that is not empty has the corresponding read operation completed.

In this example, the four entries in the ring buffer of 5-8 are not empty. So, the read requests having tag numbers 5-8 are outputted. Once the data is outputted (i.e., read by the requesting entity), the pointer is moved to the next empty location. Position 9 in this example. In addition, positions 5-8 of are released and are now at the end of the ring buffer.

Figure 30:
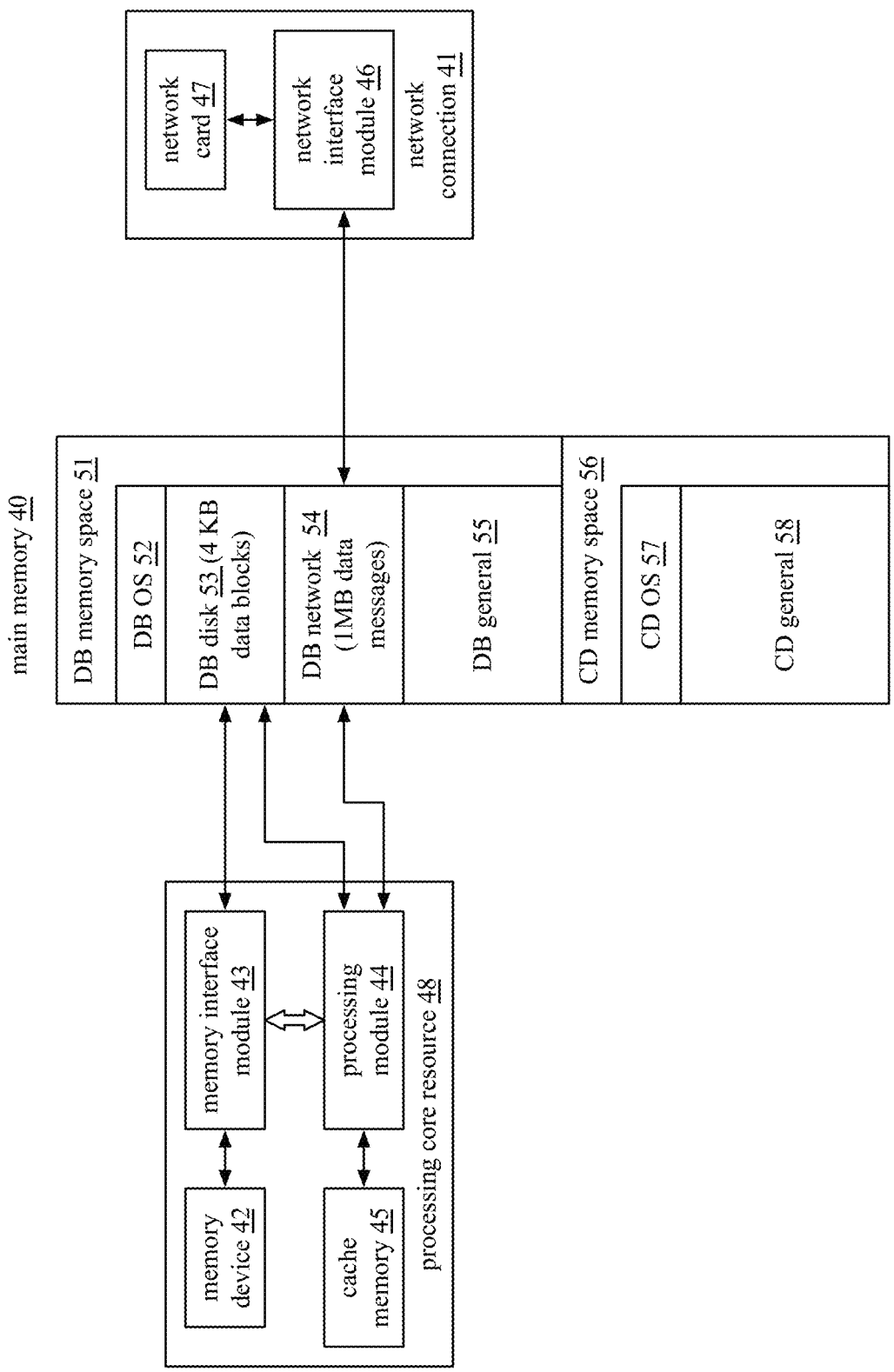
FIG. 30 is a schematic block diagram of an example of direct memory access for a processing core resource and/or for a network connection in accordance with the present invention.

FIG. 30 is a schematic block diagram of an example of direct memory access for a processing core resource 48 and/or for a network connection 41 as previously discussed. Within a computing device, the main memory 40 is logically partitioned into a database section (e.g., database memory space 51) and a computing device section (e.g., CD memory space 56 as previously discussed). In an embodiment, the main memory 40 is logically shared among the processing cores of the nodes of a computing device under the control of the database operating system. In another embodiment, the main memory 40 is further logically divided by the database operating system such that a processing core resource of a node of the computing device is allocated its own main memory.

The database memory space 51 is logically and dynamically divided into a database operating system (DB OS) 52 section, a DB disk section 53, a DB network 54 section, and a DB general 55 section. The database operating system determines the size of the disk section, the network section, and the general section based on memory requirements for various operations being performed by the processing core resources, the nodes, and/or the computing device. As such, as the processing changes within a computing device, the size of the disk section, the network section, and the general section will most likely vary based on memory requirements for the changing processing.

Within the computing device, data stored on the memory devices is done in accordance with a data block format (e.g., 4 K byte block size). As such, data written to and read from the memory devices via the disk section of the main memory is done so in 4 K byte portions (e.g., one or more 4 K byte blocks). Conversely, network messages use a different format and are typically of a different size (e.g., 1 M byte messages).

To facilitate lock free and efficient data transfers, the disk section of the main memory is formatted in accordance with the data formatting of the memory devices (e.g., 4 K byte data blocks) and the network section of the main memory is formatted in accordance with network messaging formats (e.g., 1 M byte messages). Thus, when the processing module 44 is processing disk access requests, it uses the DB disk section 53 of the main memory 40 in a format corresponding to the memory device 42. Similarly, when the processing module 44 is processing network communication requests, it uses the DB network 54 section of the main memory 40 in a format corresponding to network messaging format(s).

In this manner, accessing memory devices is a separate and independent function of processing network communication requests. As such, the memory interface module 43 can directly access the DB disk 53 section of the main memory 40 with little to no intervention of the processing module 44. Similarly, the network interface module 46 can directly access the DB network section 54 of the main memory 40 with little to no intervention of the processing module 44. This substantially reduces interrupts of the processing module 44 to process network communication requests and memory device access requests. This also allows for lock free operation of memory device access requests and network communication requests with increased parallel operation of such requests.

Figure 31:
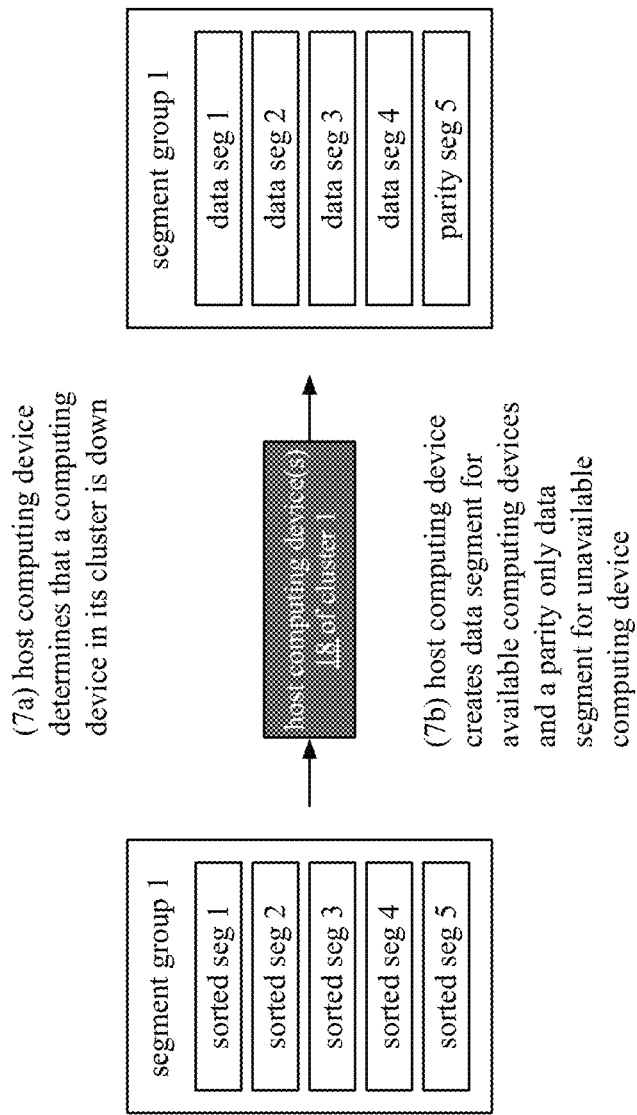
FIGS. 31-32 are schematic block diagrams of an example of processing a received data and distributed the processed table for storage in the database system when a computing device in a storage cluster is unavailable in accordance with the present invention.
Figure 32:
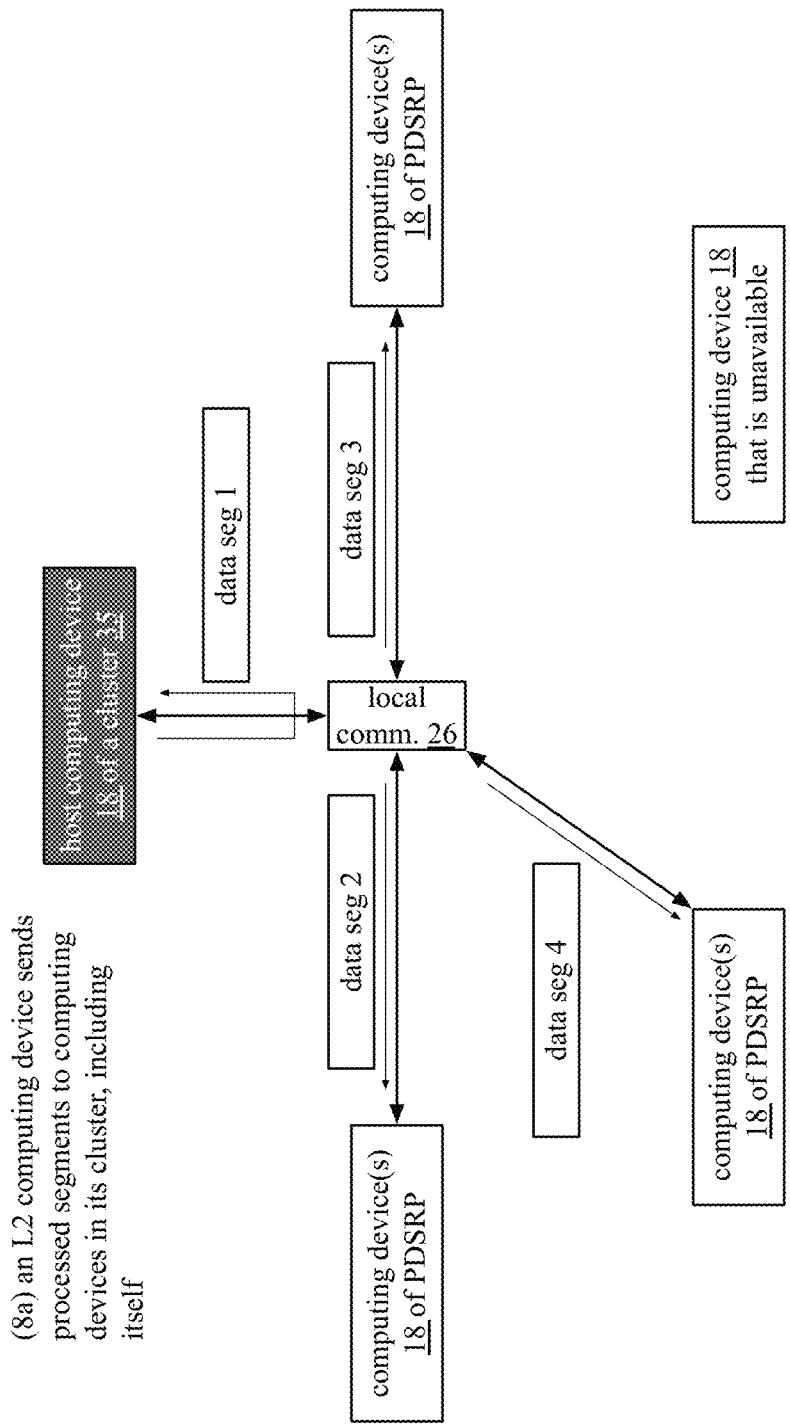

FIGS. 31-32 are schematic block diagrams of an example of processing received data and distributing the processed table for storage in the database system when a computing device 18 in a storage cluster 1 is unavailable. When this occurs, the host computing device 18 (e.g., L2 computing device of a storage cluster or L1 computing device) reorganizes a segment group or creates a different type of a segment group. In either case, the resulting segment group (assuming 5 segments in the group) has four segments that include data and a fifth segment that only includes parity data.

FIG. 32 illustrates the host computing device 18 sending, via local communications 26, the four data segments to the four active computing devices 18 in the cluster 35 and holds the parity segment for the unavailable computing device. When the unavailable computing device becomes available, the host computing device sends it the parity segment.

Figure 33:
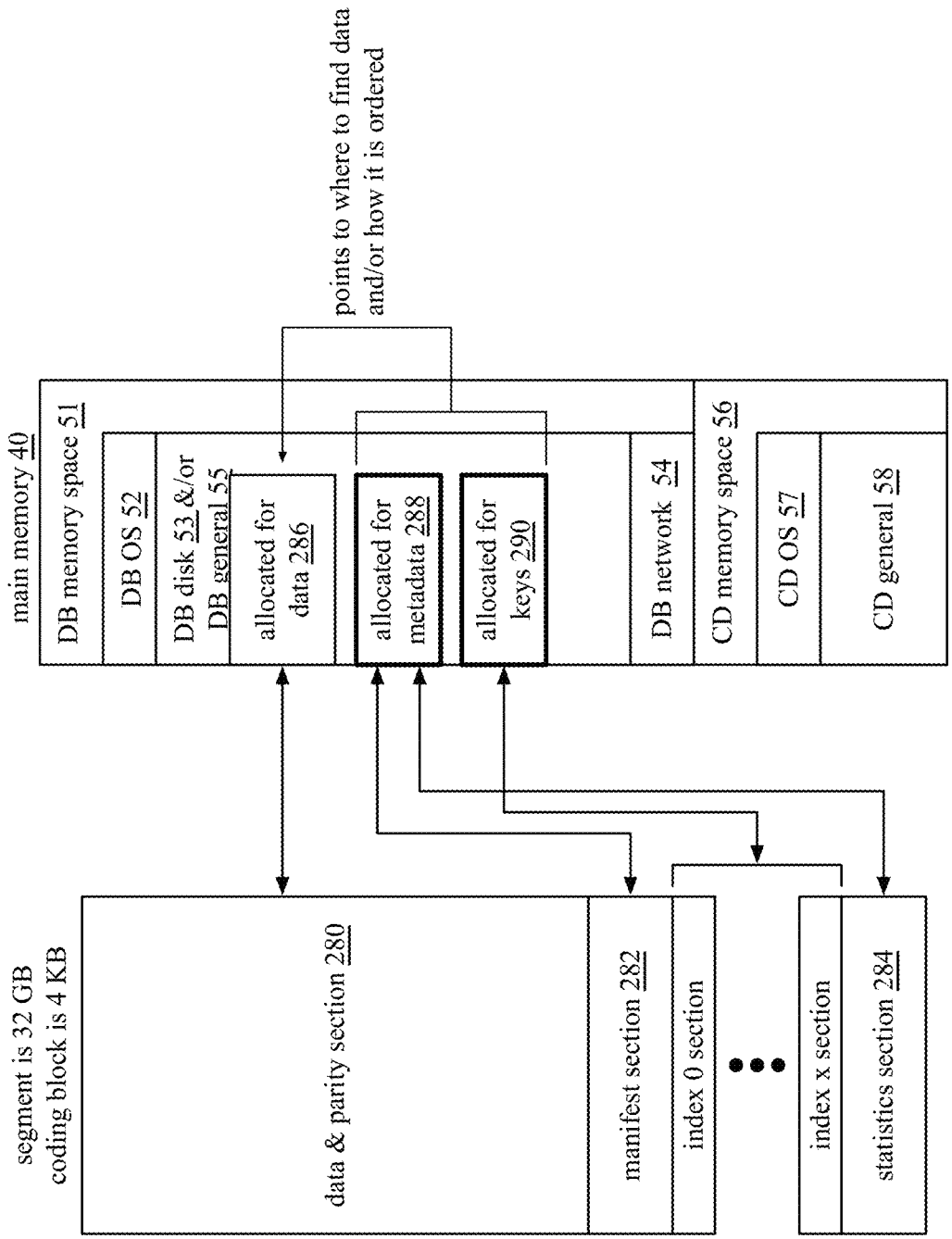
FIG. 33 is a schematic block diagram of an example of allocated memory of main memory for manifest data and/or index data of a segment associated with a processing core resource in accordance with the present invention.

FIG. 33 is a schematic block diagram of an example of using allocated memory of main memory 40 for manifest data and/or index data of a data segment associated with a processing core resource. Data segments, such as the data segment depicted on FIG. 33 are the fundamental building block for data storage, where the segment (in this example 32 GB) is divided into coding blocks of, for example 4 KB. Each data segment includes a data & parity section 280, a manifest (or metadata) section 282, and multiple index sections 0 through x, along with a statistics section 284 where appropriate.

Main memory 40, as discussed previously, can be random access memory (RAM) or any other suitable cache memory structure, is associated with each node, or can alternatively be associated with a plurality of nodes and is shown as an allocated memory resource. Specifically, the main memory 40 may be allocated to provide defined space for the example elements of a database system, including memory space allocated for data 286, memory space allocated for metadata 288, and memory space allocated for keys 290.

When the main memory 40 is not large enough to store all the metadata and key data for the associated data and parity of a data segment the metadata allocation and key data allocation in main memory can be used to point to the location of the data (along with the data ordering methodology) in a given data segment. The allocated memory illustrated for manifest data and/or index data of a data segment can be incorporated at a processing core resource, as shown, and/or at a computing device level and/or node level.

Figure 34:
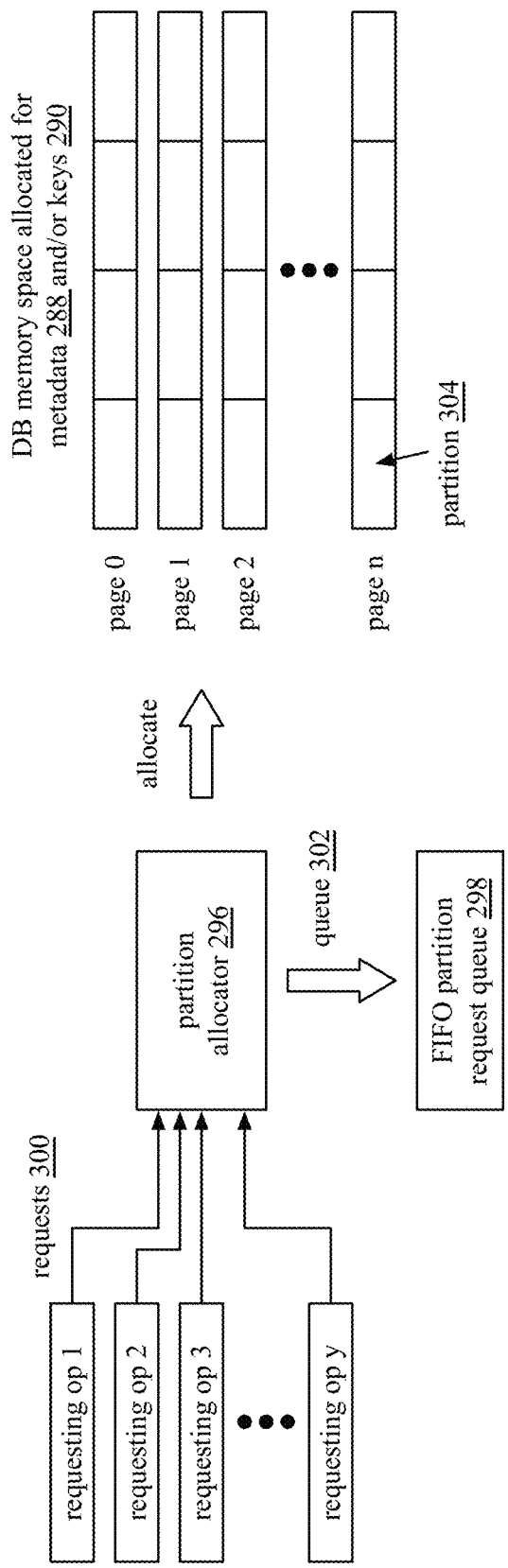
FIG. 34 is a schematic block diagram of an example of a partition allocator allocating partitions of the allocated memory of main memory to requesting operations in accordance with the present invention.

FIG. 34 provides a schematic block diagram of an example of a partition allocator 296 allocating partitions of the allocated memory of main memory to requesting operations (e.g., requests 300). Operations running on processing cores and or nodes (shown as requesting op 1 through requesting op y) execute the requests 300 over the network to one or computing devices associated with the database system. The computing devices include one more modules adapted as a partition allocator for the database memory, in order to process the requests in an ordered fashion. The partition allocator 296 is further adapted to create a queue 302 for the requests. The example shown illustrates a FIFO partition request queue 298; other alternatives include any queue that can be used to order the execution of requests from requesting entities.

Once the queue is created database memory space is allocated for the metadata 288 and/or keys 290 as discussed with regard to FIG. 33 above. In the example shown the database memory is divided into a plurality of pages (shown as pages 0 through page n). In an example there are a variable number of partitions defined for each page. For example, a page could be defined as a 1 gigabyte (GB) memory space with a partition size of 256-megabyte (MB) to render four (4) partitions per page. In an example page size can be selectable within any practical limit, and the number of partitions in each page can be selectable in a like manner.

Figure 35:
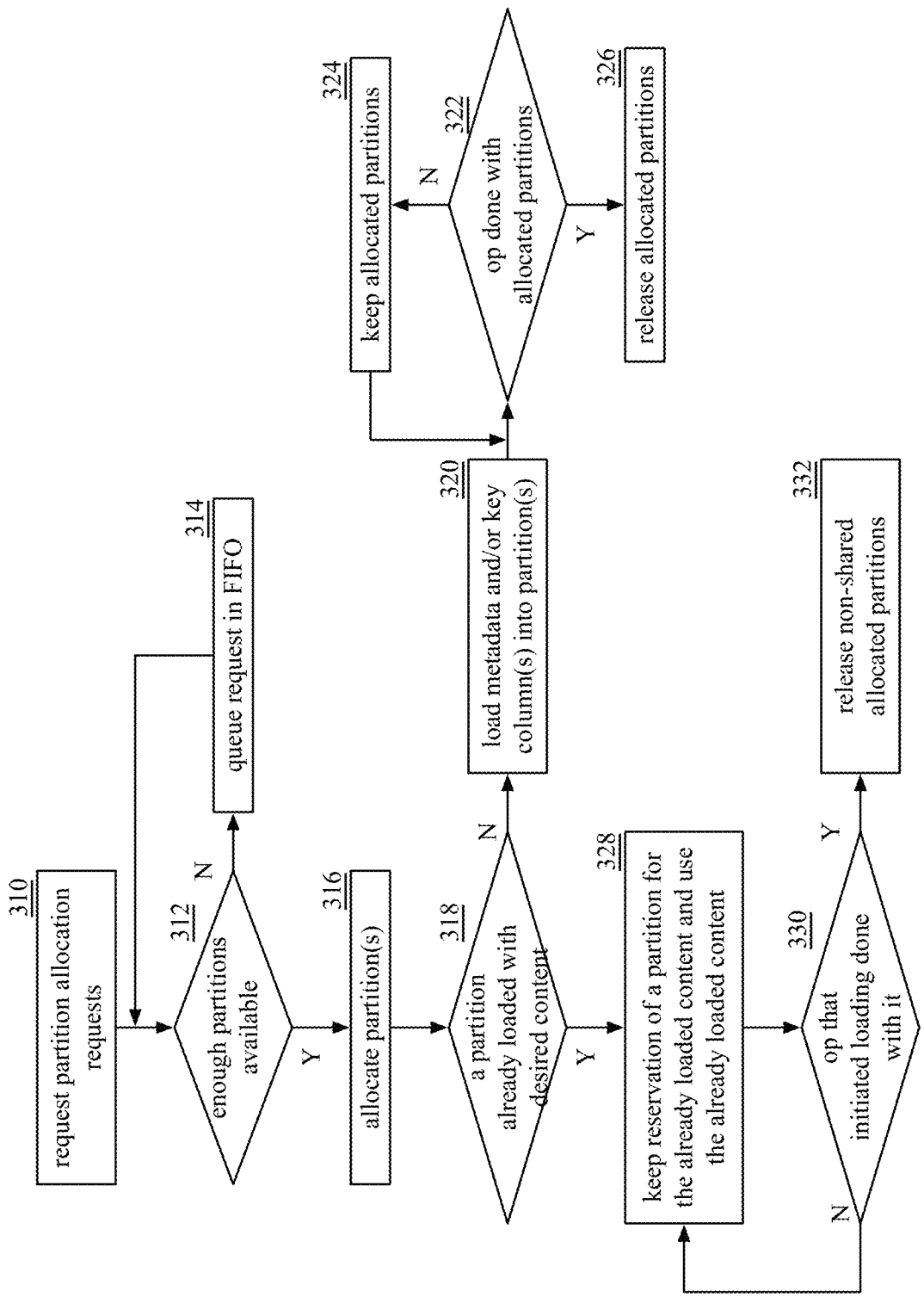
FIG. 35 is a logic diagram of an example of a method of allocating partitions of the allocated memory of main memory to requesting operations in accordance with the present invention.

FIG. 35 is a logic diagram of an example of a method of allocating partitions of the allocated memory of main memory to requesting operations. In an example, the partition allocator of FIG. 34 receives, at step 310, partition allocation requests based on operations running on processing cores and or nodes. The requests can be in response to a query initiated by the computing device receiving the request, or they may be initiated based on the operations themselves. Each operation responsible for a request will know how many partitions will be required based on the size of the metadata and/or keys it is retrieving from the database. Considering a single request received at the computing device, once the request is received at a next step the computing device determines whether enough partitions are available. At step 312, the computing device can determine whether the partitions are available based on prior knowledge and/or based on whether any requests are currently held in a partition queue, such as a FIFO queue. For example, if a FIFO queue has been created and already includes a previous request the computing device will determine that sufficient partitions are not available to service the request. In this case, at step 314, the request is queued in the FIFO queue in a step where the request is cycled through to the previous step 312.

If enough partitions are available the computing device allocates partitions at step 316, and at the next step 318, determines whether a partition has already been loaded with the desired content, where the content is the metadata for an associated data segment and/or a portion of the key column (s) for the associated data segment. If a partition has not already been loaded with the desired content the metadata and/or key column(s) are loaded into the identified partitions at next step 320. At step 322 the computing device determines whether the operation is done executing with the allocated partitions, and when it is, at step 326, the computing device releases the allocated partitions for use by another operation. When the operation is not executed with the allocated partitions, at step 324, the computing device ensures that the allocated partitions are maintained until the operation is executed or times out. Each operation requesting a partition is required to guarantee that the associated request can be either executed or that progress can be made toward execution so that the partition will not be deadlocked.

Additionally, a duty cycle can be established whereby on a regular interval each operation with one or more partitions that have been allocated are released and the operation associated with the request will initiate new partition requests for the same content. In such a case already allocated data can remain in main memory. The duty cycle can be based on a "deadlock avoidance" contract that all operations follow in order to ensure that nonperforming operations release allocated partitions on a regular interval in order to avoid locking up memory partitions and thereby decreasing performance of database operations.

When a partition has already been loaded with the desired content the method continues at step 328, where the computing device retains the partition(s) for already loaded content and the content is used for execution by the associated requestor(s). At step 330, the computing device determines whether the operation that initiated the partition allocation has been executed and when the operation has been executed the computing device releases the allocated partitions in main memory at step 332, as long as the partitions are not shared with another request and/or operation. When the computing device determines that the operation has not completed execution associated with the underlying request the computing device retains the allocated partition until the execution is complete by looping back to step 328.

Figure 36:
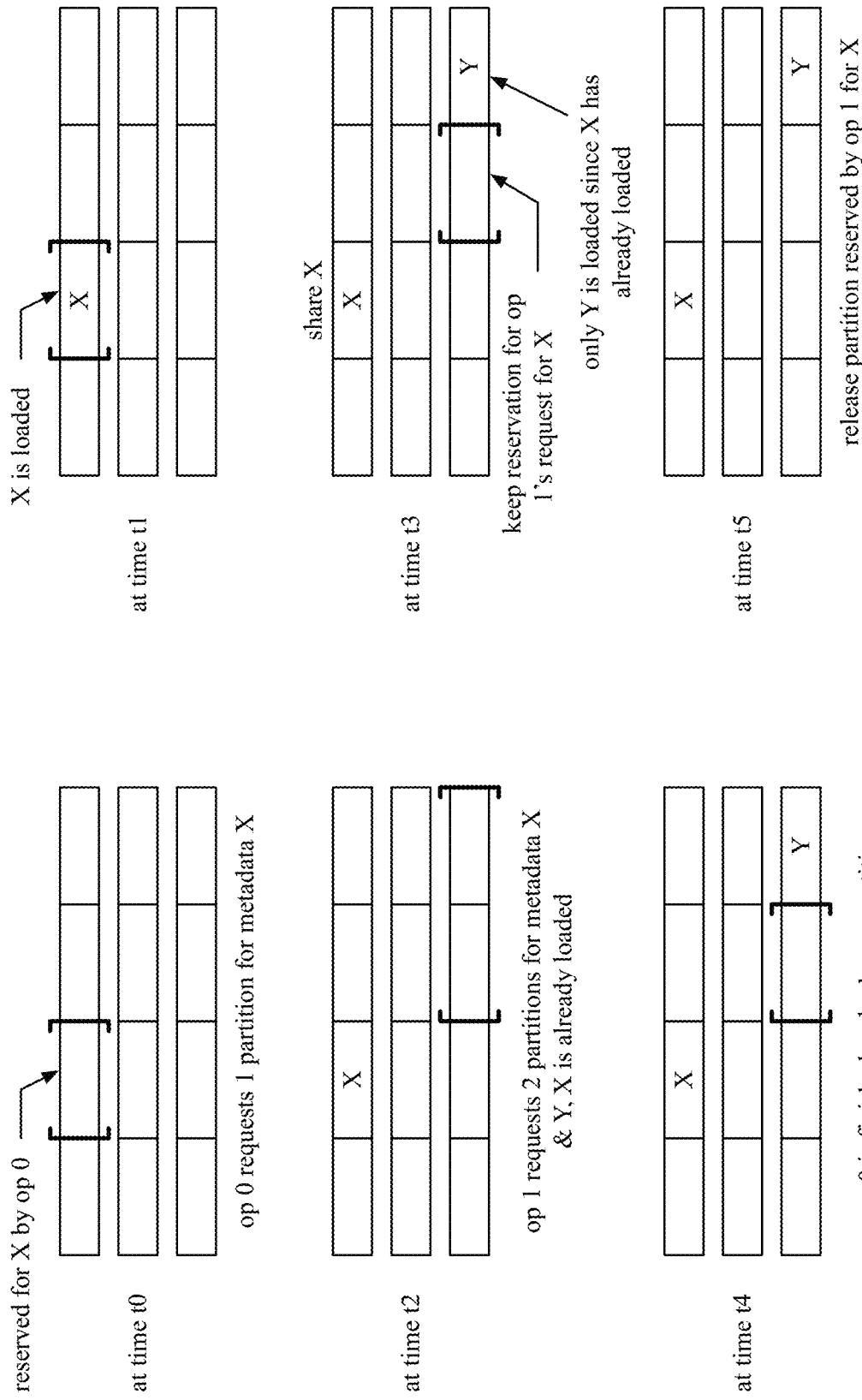
FIG. 36 is a schematic block diagram of another example of a partition allocator allocating partitions of the allocated memory of main memory to requesting operations in accordance with the present invention.

FIG. 36 is a schematic block diagram of another example of a partition allocator allocating partitions of the allocated memory of main memory to requesting operations. In an example at time t0 a single partition is reserved by an operation (op 0) for particular content, in this case metadata X. At time t1 metadata X has been loaded in main memory for the requesting operation. At time t2 another operation (op 1) requests two (2) partitions to be allocated for each of metadata X, which has already been loaded and metadata Y. At time t3 op 0 and op 1 share the already loaded metadata X and metadata Y is loaded (metadata X is not loaded again, since it has already been loaded) and the reservation for op 1 request for metadata X is maintained.

At time t4 op 0 has completed execution of the operation for which metadata x was loaded and releases the allocated partition for metadata X, but metadata X is not released, because op 1 may still be using it. At time t5 both op 0 and op 1 are complete, so the partition reserved by op 1 for X is released.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for buffering data from non-volatile memory into volatile memory, the method comprises:
    identifying, by a processing entity of a computing device, a plurality of data units to read from non-volatile memory and to write into ordered buffers of volatile memory, wherein data units of the plurality of data units have a variety of data sizes, wherein the plurality of data units is stored in "n" number of logical data blocks of the non-volatile memory, wherein a data unit of the plurality of data units is at least partially stored in two or more logical data blocks of the "n" number of logical data blocks of the non-volatile memory, and wherein "n" is an integer greater than or equal to two;
    generating, by the processing entity, read operations regarding the plurality of data units, wherein the number of read operations equals "n";
    tagging, by the processing entity, each read operation of the read operations with a unique ordered tag value, wherein a first read operation of the read operations is regarding a first logical data block of the "n" number of logical data blocks of the non-volatile memory and is tagged with a first ordered tag value;
    receiving, by the processing entity, read responses to the read operations from the non-volatile memory, wherein a first read response of the read responses is in response to the first read operation and includes the first ordered tag value;
    writing, by the processing entity, data units contained in the read responses into the ordered buffers in accordance with the ordered tag values; and
    tracking, by the processing entity, consumption of the plurality of data units from the ordered buffers.

2. The method of claim 1, wherein the identifying the plurality of data units comprises:
    receiving, by the processing entity, an operation that includes reading the plurality of data units from the disk memory and writing the plurality of data units into the ordered buffer.

3. The method of claim 1 further comprises:
    accessing, by the processing entity, metadata regarding the plurality of data units to read;
    determining, by the processing entity, a specific number "n" of the "n" number of logical data blocks of the non-volatile memory based on the metadata; and
    allocating, by the processing entity, the specific number of logical data blocks of the volatile memory for the ordered buffers.

4. The method of claim 3 further comprises:
    executing, by the processing entity, an ordered buffer function of a process specific operating system of the computing device, wherein the process specific operating system overrides, with respect to the volatile memory, a general operating system of the computing device.

5. The method of claim 1, wherein the writing comprises:
    comparing an order tag value of a current received read response of the read responses with a next expected tag value;
    when the order tag value of the current received read response compares unfavorably with the next expected tag value:
        queuing the tag of the current received read response;
        writing one or more partial data units contained in the current received read response to one of the ordered buffers based on the ordered data tag; and
        indicating that the one or more partial data units are not available for consumption;
    when the order tag value of the current received read response compares favorably with the next expected tag value:
        writing the one or more partial data units contained in the current received read response to one of the ordered buffers based on the ordered data tag;
        indicating that the one or more partial data units are available for consumption; and
        incrementing the next expected tag value.

6. The method of claim 5 further comprises:
    when the order tag value of the current received read response compares favorably with the next expected tag value:
        determining whether the incremented next expected tag value is equal to or exceeds a queued tag; and when the incremented next expected tag value is equal to or exceeds a queued tag, indicating that content of a corresponding read response is now available for consumption.

7. The method of claim 1 further comprises:
determining, by the processing entity, a unique data unit count value for each read operation of the "n" number of read operations, wherein a first data unit count value indicates a number of data units that are at least partially within the first logical data block.

8. The method of claim 7, wherein the tracking comprises:
decrementing the first data unit count value as data units of the number of data units that are at least partially within the first logical data block are consumed; and
when the first data unit count value is zero, releasing an ordered buffer of the ordered buffers associated with the first logical data block.

9. The method of claim 1, wherein the processing entity comprises one or more of:
one or more processing core resources of the computing device;
one or more nodes of the computing device;
one or more processing core resources of another computing device; and
one or more nodes of the other computing device.

10. The method of claim 1 further comprises:
the volatile memory including random access memory; and
the non-volatile memory including one or more of a solid-state memory device and a disk memory device, wherein the logical data blocks storing the plurality of data units are contiguous and wherein physical memory locations of the disk memory storing the plurality of data units is not contiguous.

11. A computer readable memory device comprises:
a first memory section operable to store operational instructions that, when executed by a processing entity of a computing device, causes the processing entity to:
identify a plurality of data units to read from non-volatile memory and to write into ordered buffers of volatile memory, wherein data units of the plurality of data units have a variety of data sizes, wherein the plurality of data units is stored in "n" number of logical data blocks of the non-volatile memory, wherein a data unit of the plurality of data units is at least partially stored in two or more logical data blocks of the "n" number of logical data blocks of the non-volatile memory, and wherein "n" is an integer greater than or equal to two;
generate read operations regarding the plurality of data units, wherein the number of read operations equals "n"; and
tag each read operation of the read operations with a unique ordered tag value, wherein a first read operation of the read operations is regarding a first logical data block of the "n" number of logical data blocks of the non-volatile memory and is tagged with a first ordered tag value;
a second memory section operable to store operational instructions that, when executed by the processing entity, causes the processing entity to:
receive read responses to the read operations from the non-volatile memory, wherein a first read response of the read responses is in response to the first read operation and includes the first ordered tag value;
write data units contained in the read responses into the ordered buffers in accordance with the ordered tag values; and
track consumption of the plurality of data units from the ordered buffers.

12. The computer readable memory device of claim 11, wherein the first memory section further stores operational instructions that, when executed by the processing entity, causes the processing entity to identifying the plurality of data units by:
receiving an operation that includes reading the plurality of data units from the disk memory and writing the plurality of data units into the ordered buffer.

13. The computer readable memory device of claim 11, wherein the first memory section further stores operational instructions that, when executed by the processing entity, causes the processing entity to:
access metadata regarding the plurality of data units to read;
determine a specific number "n" of the "n" number of logical data blocks of the non-volatile memory based on the metadata; and
allocate the specific number of logical data blocks of the volatile memory for the ordered buffers.

14. The computer readable memory device of claim 13, wherein the first memory section further stores operational instructions that, when executed by the processing entity, causes the processing entity to:
execute an ordered buffer function of a process specific operating system of the computing device, wherein the process specific operating system overrides, with respect to the volatile memory, a general operating system of the computing device.

15. The computer readable memory device of claim 11, wherein the second memory section further stores operational instructions that, when executed by the processing entity, causes the processing entity to write the data units by:
comparing an order tag value of a current received read response of the read responses with a next expected tag value;
when the order tag value of the current received read response compares unfavorably with the next expected tag value:
queuing the tag of the current received read response;
writing one or more partial data units contained in the current received read response to one of the ordered buffers based on the ordered data tag; and
indicating that the one or more partial data units are not available for consumption;
when the order tag value of the current received read response compares favorably with the next expected tag value:
writing the one or more partial data units contained in the current received read response to one of the ordered buffers based on the ordered data tag;
indicating that the one or more partial data units are available for consumption; and
incrementing the next expected tag value.

16. The computer readable memory device of claim 15, wherein the second memory section further stores operational instructions that, when executed by the processing entity, causes the processing entity to:
when the order tag value of the current received read response compares favorably with the next expected tag value:
determining whether the incremented next expected tag value is equal to or exceeds a queued tag; and when the incremented next expected tag value is equal to or exceeds a queued tag, indicating that content of a corresponding read response is now available for consumption.

17. The computer readable memory device of claim 11, wherein the first memory section further stores operational instructions that, when executed by the processing entity, causes the processing entity to:

determine a unique data unit count value for each read operation of the "n" number of read operations, wherein a first data unit count value indicates a number of data units that are at least partially within the first logical data block.

18. The computer readable memory device of claim 17, wherein the second memory section further stores operational instructions that, when executed by the processing entity, causes the processing entity to track by:

decrementing the first data unit count value as data units of the number of data units that are at least partially within the first logical data block are consumed; and when the first data unit count value is zero, releasing an ordered buffer of the ordered buffers associated with the first logical data block.

19. The computer readable memory device of claim 11, wherein the processing entity comprises one or more of:

one or more processing core resources of the computing device;

one or more nodes of the computing device;

one or more processing core resources of another computing device; and one or more nodes of the other computing device.

20. The computer readable memory device of claim 11 further comprises:

the volatile memory including random access memory; and the non-volatile memory including one or more of a solid-state memory device and a disk memory device, wherein the logical data blocks storing the plurality of data units are contiguous and wherein physical memory locations of the disk memory storing the plurality of data units is not contiguous.

* * * * *